United States Patent
Wang et al.

(10) Patent No.: US 9,685,228 B2
(45) Date of Patent: *Jun. 20, 2017

(54) REFERENCE AND SENSING WITH BIT LINE STEPPING METHOD OF MEMORY

(71) Applicant: MACRONIX INTERNATIONAL CO., LTD., Hsinchu (TW)

(72) Inventors: Tien-Yen Wang, Hsinchu County (TW); Chun-Hsiung Hung, Hsinchu (TW); Chia-Jung Chen, Burlington, VT (US)

(73) Assignee: MACRONIX INTERNATIONAL CO., LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/747,386

(22) Filed: Jun. 23, 2015

(65) Prior Publication Data

US 2015/0302922 A1    Oct. 22, 2015

Related U.S. Application Data

(63) Continuation of application No. 13/861,970, filed on Apr. 12, 2013, now Pat. No. 9,147,449.

(60) Provisional application No. 61/769,203, filed on Feb. 26, 2013.

(51) Int. Cl.
G11C 11/00 (2006.01)
G11C 13/00 (2006.01)
G11C 7/12 (2006.01)
G11C 7/02 (2006.01)
G11C 7/14 (2006.01)
G11C 11/56 (2006.01)

(52) U.S. Cl.
CPC ............ *G11C 13/004* (2013.01); *G11C 7/02* (2013.01); *G11C 7/12* (2013.01); *G11C 7/14* (2013.01); *G11C 11/5678* (2013.01); *G11C 13/0004* (2013.01); *G11C 2013/0045* (2013.01); *G11C 2013/0054* (2013.01)

(58) Field of Classification Search
CPC .................................................... G11C 11/00
USPC ......................................................... 365/148
See application file for complete search history.

(56) References Cited

U.S. PATENT DOCUMENTS

| | | |
|---|---|---|
| 6,191,989 B1 | 2/2001 | Luk et al. |
| 8,644,056 B2 | 2/2014 | Oh |
| 2006/0092689 A1* | 5/2006 | Braun ............... G11C 7/067 365/158 |
| 2008/0310243 A1 | 12/2008 | Jung et al. |
| 2009/0201717 A1* | 8/2009 | Maeda ............... G11C 11/16 365/148 |
| 2010/0054020 A1* | 3/2010 | Ueda ............... G11C 7/062 365/148 |
| 2011/0222355 A1* | 9/2011 | Nakashima ...... G11C 13/004 365/189.09 |
| 2011/0317497 A1* | 12/2011 | Yoon ............... G11C 13/0004 365/189.05 |

(Continued)

*Primary Examiner* — Min Huang
(74) *Attorney, Agent, or Firm* — Volpe and Koenig, P.C.

(57) ABSTRACT

A sensing method for a memory is provided. The memory includes: a memory cell; a reference circuit generating a reference voltage and a clamp voltage; and a current supplying circuit receiving the clamp voltage to develop a cell current passing through the memory cell to form a cell voltage, wherein the cell voltage is used for incorporating with the reference voltage to determine the information stored in the memory.

12 Claims, 18 Drawing Sheets

(56) References Cited

U.S. PATENT DOCUMENTS

2012/0155157 A1\* 6/2012 Oh ..................... G11C 11/1675
365/158
2014/0286088 A1\* 9/2014 Takahashi ........... G11C 11/1673
365/158

\* cited by examiner

REFERENCE AND SENSING WITH BIT LINE STEPPING METHOD OF MEMORY

CROSS REFERENCE TO RELATED APPLICATION

This application is a continuation of U.S. patent application Ser. No. 13/861,970, filed Apr. 12, 2013, which claims the benefit of list any U.S. provisional application No. 61/769,203, filed Feb. 26, 2013, which is incorporated by reference as if fully set forth.

FIELD OF INVENTION

The present invention relates to a reference and sensing with bit line stepping method of the memory.

BACKGROUND

The phase change memory (PCM) is a type of non-volatile random-access memory and includes an array of PCM cells arranged on the cross-points of the word lines in row and the bit lines in column. The respective PCM cells have an activation region made of the phase change material capable of being switched between an amorphous and a crystalline state by heating the memory cell. Usually the amorphous and the crystalline states respectively have different detectable characteristics, such as the resistance or the electrical resistivity, so as to provide a distinguishable scale between both states to store the binary information in the respective PCM cells.

FIG. 1 presents a common behavior of a phase change memory (PCM) cell, wherein each curve presents the current profile vs. the resistance value. FIG. 1 shows that if the PCM cell has a higher resistance, then the PCM cell correspondingly has a higher threshold voltage ($V_{THS}$).

In order to reset the PCM cell, a high voltage which is higher than $V_{THS}$ must be provided. Such a step, which is usually referred to as breaking down the cell, results in a high current on the PCM cell path to generate heat for melting the PCM material.

However, in any time, if a voltage is close to $V_{THS}$ is accidentally applied to the bit line (BL), the cell might be disturbed. Therefore, a conventional way of sensing is usually to apply a relatively low voltage to the bit line.

Such a low sensing voltage on the bit line is appropriate if the multi-level cell (MLC) or the margin check is not concerned. As shown in FIG. 2, in which the solid line and the dotted line respectively represent the current value on the low and high resistance PCM developed by the applied BL voltage, the two turns of the dotted line show the aforementioned breaking down when the applied voltage is too large. Under such a condition, the dotted line represents a profile turning from the high resistance to the low resistance. According to FIG. 2, when a voltage is applied to the BL, the window between the two current generated by the high and low resistance PCM is large, and thus the reference for differentiating between the two current can be placed at any point inside the window.

FIG. 3 illustrates the suffered difficulty when a data reading process is performed on a high resistance PCM cell for a multi-level cell (MLC) and a margin check. For example if the PCM cell has a 2.1 mega-ohm resistance, the reference resistance is 2 mega-ohm and in the mean time the read bit line voltage is assumed 0.4V, then the obtained cell current is 190 nA and the reference current is 200 nA. Subject to the condition, it is difficult to precisely distinguish such a minor current difference.

It is therefore attempted by the applicant to deal with the above situation encountered in the prior art.

SUMMARY

In accordance with the first aspect of the present invention, a memory is provided. The memory includes: a memory cell; a reference circuit generating a reference voltage and a clamp voltage; and a current supplying circuit receiving the clamp voltage to develop a cell current passing through the memory cell to form a cell voltage, wherein the cell voltage is used for incorporating with the reference voltage to determine an information stored in the memory.

Preferably, the memory further includes: a first supply reference voltage; a second supply reference voltage, wherein the current supplying circuit includes: a first current source having a first terminal and a second terminal; and a first MOSFET having a first terminal, a second terminal and a gate terminal, wherein the first terminal of the first MOSFET receives the first supply reference voltage, the second terminal of the first current source is coupled to the first terminal of the first MOSFET, the second terminal of the first MOSFET is coupled to the memory cell, wherein the cell voltage is obtained at a node where the second terminal of the first current source is coupled to the first terminal of the first MOSFET, and the clamp voltage is provided to the gate of the first MOSFET.

Preferably, the memory further includes: a first pre-charge circuit having a first output terminal coupled to one of the second terminal of the first current source and the first terminal of the first MOSFET.

Preferably, the reference circuit further generates a reference current, and includes a second, a third and a fourth current sources, a first and a second parasitic resistors, a first and a second reference resistors, a second and a third MOSFETs, and a second pre-charge circuit, wherein each of the second, the third and the fourth current sources, the first and the second parasitic resistors, and the first and the second reference resistors has a first and a second terminals, and each of the second and the third MOSFETs has a first, a second and a gate terminal, wherein the first terminal of the second current source is coupled to the first supply reference voltage, the second terminal of the second current source is coupled to the first terminal of the first parasitic resistor and the gate terminal of the second MOSFET, the second terminal of the first parasitic resistor is coupled to the first terminal of the first reference resistor, the second terminal of the first reference resistor receives the second supply reference voltage, the first terminal of the third current source receives the first supply reference voltage, the second terminal of the third current source is coupled to the first terminal of the first terminal of the second MOSFET and the gate terminal of the third MOSFET, the second terminal of the second MOSFET receives the second supply reference voltage, the first terminal of the fourth current source receives the first supply reference voltage, the second terminal of the fourth current source is coupled to the first terminal of the third MOSFET, the second terminal of the third MOSFET is coupled to the first terminal of the second parasitic resistor, the second terminal of the second parasitic resistor is coupled to the first terminal of the second reference resistor, the second terminal of the second reference resistor receives the second supply reference voltage, and the second pre-charge circuit has a first output terminal coupled to one of the second terminal of the fourth current source and the first terminal of the third MOSFET, wherein each of the second, the third and the fourth current sources supplies a reference current, one of the second terminal of the fourth current source and the first terminal of the third MOSFET provides the reference voltage, and one of the second terminal of the third current source and the first terminal of the second MOSFET provides the clamp voltage.

Preferably, each of the first, the second, the third and the fourth current sources is a current mirror circuit.

Preferably, the first pre-charge circuit includes a fourth MOSFET having a first, a second and a gate terminals, the first terminal of the fourth MOSFET receives the first supply reference voltage, the second terminal of the fourth MOSFET is the first output terminal of the first pre-charge circuit, and the gate terminal of the fourth MOSFET receives a pre-charge trigger signal.

Preferably, the second pre-charge circuit includes a fifth MOSFET having a first, a second and a gate terminals, the first terminal of the fifth MOSFET receives the first supply reference voltage, the second terminal of the fifth MOSFET is the first output terminal of the second pre-charge circuit, and the gate terminal of the fifth MOSFET receives the pre-charge trigger signal.

Preferably, the memory further includes a sense amplifier (SA) receiving the cell voltage and the reference voltage to determine the information stored in the memory.

Preferably, the memory as claimed in claim 8, when applied to a multi-level cell (MLC) memory, further includes a second reference circuit generating a second reference current, a second reference voltage and a second clamp voltage, wherein the clamp voltage is a first clamp voltage, the reference voltage is a first reference voltage, the first clamp voltage and the second clamp voltage are provided to the current supplying circuit through a first multiplexer (MUX) to develop a second cell current passing through the memory cell to develop a second cell voltage, one of the first and the second reference voltages is provided to the sense amplifier through a second MUX to be respectively compared with one of the first and the second cell voltages to determine the information stored in the memory.

In accordance with the second aspect of the present invention, a method for reading a memory is provided. The method includes: providing a memory cell; generating a reference voltage and a clamp voltage; and developing a cell current, based on the clamp voltage, passing through the memory cell to form a cell voltage used for incorporating with the reference voltage to determine an information stored in the memory.

Preferably, the memory further includes a first supply reference voltage and a second supply reference voltage, the developing step is performed by a current supplying circuit to form the cell voltage, and the current supplying circuit includes: a first current source having a first terminal and a second terminal; and a first MOSFET having a first terminal, a second terminal and a gate terminal, wherein the first terminal of the first MOSFET receives the first supply reference voltage, the second terminal of the first current source is coupled to the first terminal of the first MOSFET, the second terminal of the first MOSFET is coupled to the memory cell, wherein the cell voltage is obtained at a node where the second terminal of the first current source is coupled to the first terminal of the first MOSFET, and the clamp voltage is provided to the gate of the first MOSFET.

Preferably, the method includes: providing a first pre-charge circuit to reduce a set up time of the cell voltage.

Preferably, the method further includes: providing a reference circuit generating a reference current, the reference voltage and the clamp voltage, wherein the reference circuit includes: a second, a third and a fourth current sources, a first and a second parasitic resistors, a first and a second reference resistors, a second and a third MOSFETs, and a second pre-charge circuit, wherein each of the second, the third and the fourth current sources, the first and the second parasitic resistors, and the first and the second reference resistors has a first and a second terminals, and each of the second and the third MOSFETs has a first, a second and a gate terminals; wherein the first terminal of the second current source receives the first supply reference voltage, the second terminal of the second current source is coupled to the first terminal of the first parasitic resistor and the gate terminal of the second MOSFET, the second terminal of the first parasitic resistor is coupled to the first terminal of the first reference resistor, the second terminal of the first reference resistor receives the second supply reference voltage, the first terminal of the third current source receives the first supply reference voltage, the second terminal of the third current source is coupled to the first terminal of the second MOSFET and the gate terminal of the third MOSFET, the second terminal of the second MOSFET receives the second supply reference voltage, the first terminal of the fourth current source receives the first supply reference voltage, the second terminal of the fourth current source is coupled to the first terminal of the third MOSFET, the second terminal of the third MOSFET is coupled to the first terminal of the second parasitic resistor, the second terminal of the second parasitic resistor receives the first terminal of the second reference resistor, the second terminal of the second reference resistor receives the second supply reference voltage, and the second pre-charge circuit has a first output terminal coupled to one of the second terminal of the fourth current source and the first terminal of the third MOSFET; and wherein each of the second, the third and the fourth current sources supplies a reference current, one of the second terminal of the fourth current source and the first terminal of the third MOSFET provides the reference voltage, and one of the second terminal of the third current source and the first terminal of the second MOSFET provides the clamp voltage.

Preferably, each of the first, the second, the third and the fourth current sources is a current mirror circuit.

Preferably, the first pre-charge circuit is a fourth MOSFET, the fourth MOSFET has a first, a second and a gate terminals, the first terminal of the fourth MOSFET receives the first supply reference voltage, the second terminal of the fourth MOSFET is the first output terminal of the first pre-charge circuit, and the gate terminal of the fourth MOSFET receives a pre-charge trigger signal.

Preferably, the second pre-charge circuit is a fifth MOSFET, the fifth MOSFET has a first, a second and a gate terminals, the first terminal of the fifth MOSFET receives the first supply reference voltage, the second terminal of the fifth MOSFET is the first output terminal of the second pre-charge circuit, and the gate terminal of the fifth MOSFET receives the pre-charge trigger signal.

Preferably, the step of determining an information stored in the memory includes a step of comparing the cell voltage and the reference voltage to determine the information stored in the memory.

Preferably, the method, when applied to a multi-level cell (MLC) memory, further includes a step of using a second reference circuit to generate a second reference current, a second reference voltage and a second clamp voltage, wherein the clamp voltage is a first clamp voltage, and the first and the second clamp voltages are provided to the current supplying circuit through a first multiplexer (MUX) to develop a second cell current passing through the memory cell to develop a second cell voltage, the reference voltage is a first reference voltage, and one of the first and the second reference voltages is provided to the sense amplifier through a second MUX to be respectively compared with one of the first and the second cell voltages to determine the information stored in the memory.

In accordance with the third aspect of the present invention, a method for reading a memory is provided. The method includes: providing a memory cell; passing a current through the memory cell to form a cell voltage; and comparing the cell voltage and a reference voltage to determine information stored in the memory.

Preferably, the passing step includes steps of: generating a reference voltage and a clamp voltage; and developing a cell current as the current based on the clamp voltage.

The present disclosure may best be understood through the following descriptions with reference to the accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
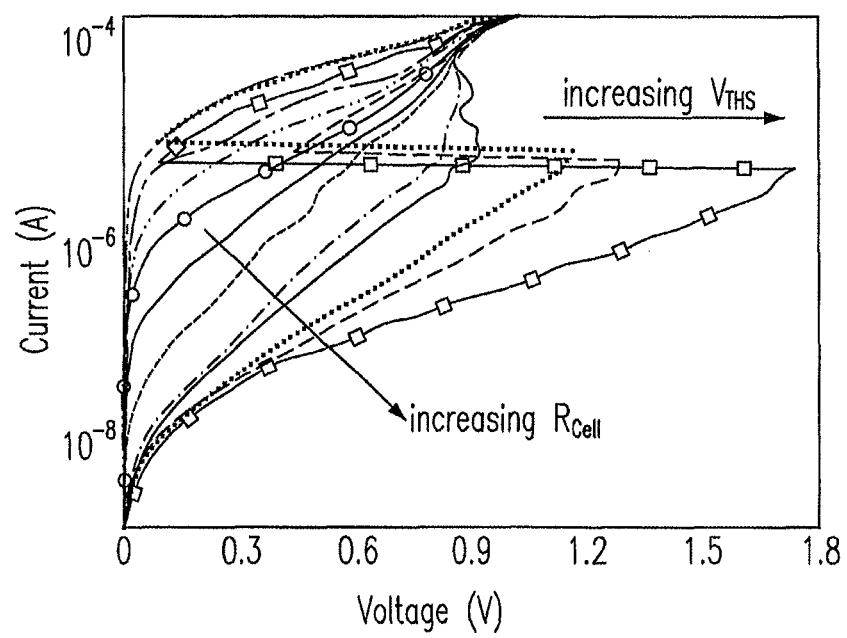
FIG. 1 presents a common behavior of a phase change memory (PCM) cell.
Figure 2:
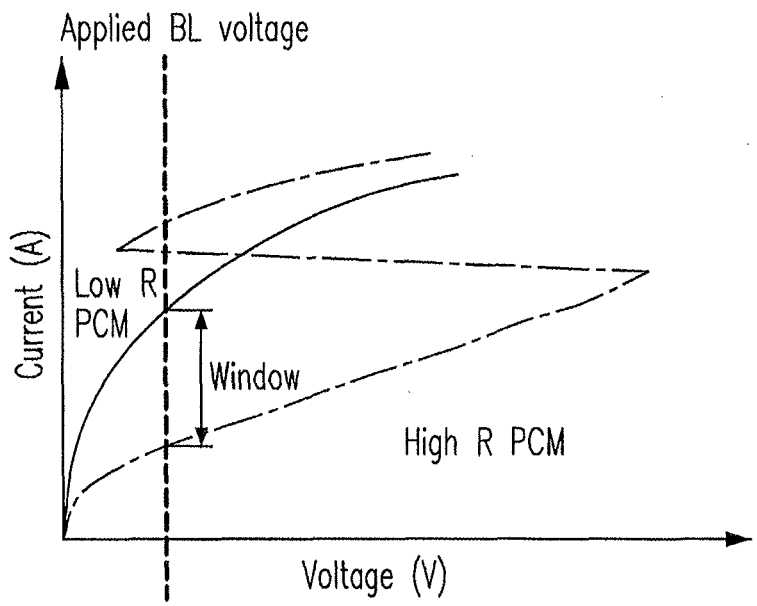
FIG. 2 illustrates the window between the two current generated by the high and low resistance PCM when a voltage is applied to the bit line (BL)
Figure 3:
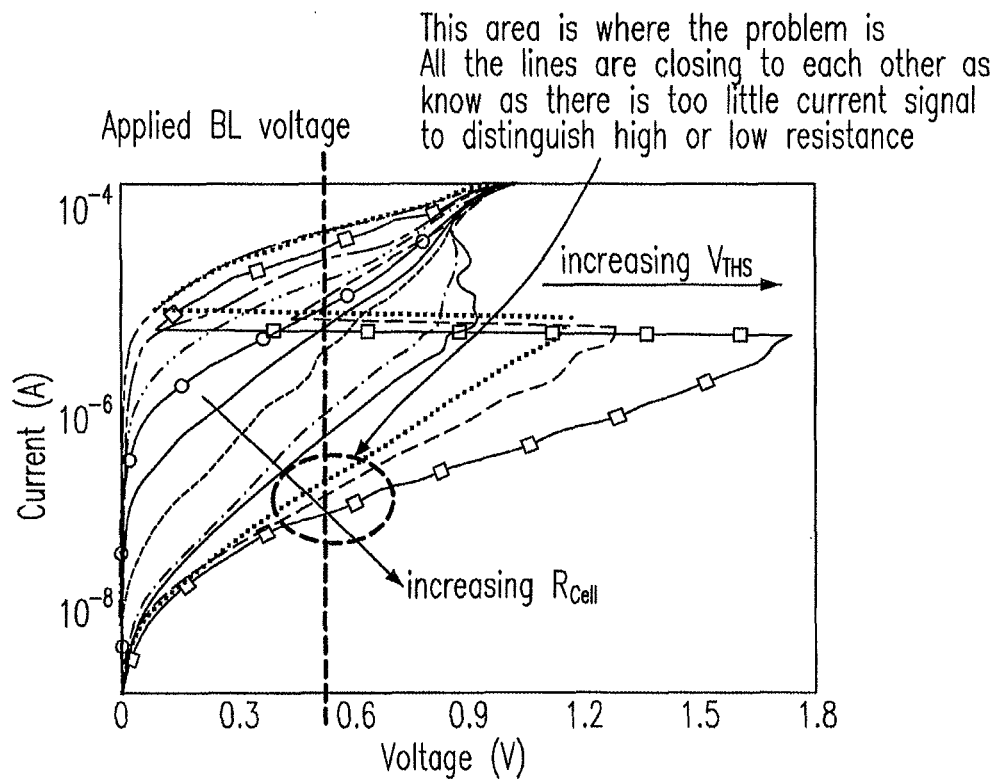
FIG. 3 illustrates the suffered difficulty when a data reading process is performed on a high resistance PCM cell for a multi-level cell (MLC) and a margin check.
Figure 4A:
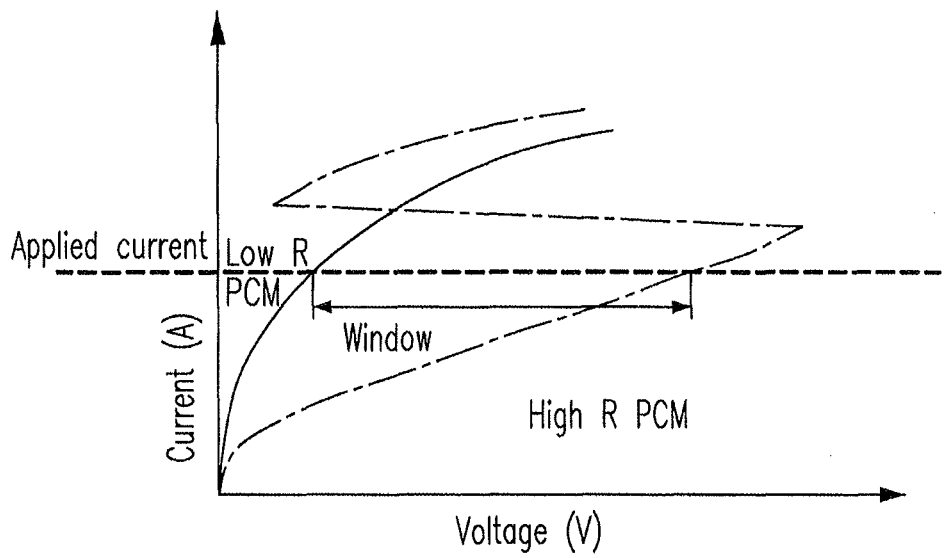
FIG. 4a and FIG. 4b show a phenomenon that if a cell current of several μA or less is given, the cell never breakdown and the window between the voltage values obtained by the high and low resistance PCM is larger.
Figure 4B:
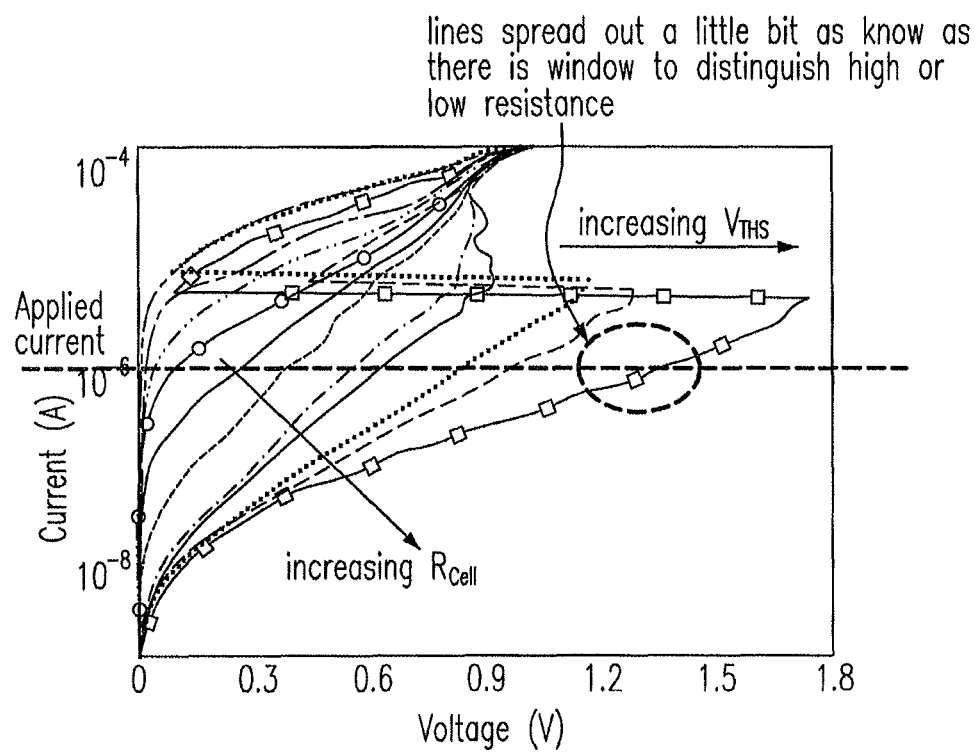

Although the non-volatile memory is took for example in the following embodiments, the appliable range is not limited to the non-volatile memory. FIG. 4a and FIG. 4b show a phenomenon that if a cell current of several μA or less is given, the cell never breakdown and the window between the voltage values obtained by the high and low resistance PCM is larger. Check again with the previous example in the background section in this specification, it is assumed that cell resistance is 2.1 mega-ohm and reference resistance is 2 mega-ohm, and also assumed that a current of 1 μA is applied on the BL and reference. The voltage obtained on the cell and reference is 2.1V and 2V. It is much easier to sense a difference of 0.1V in voltage.

Figure 5:
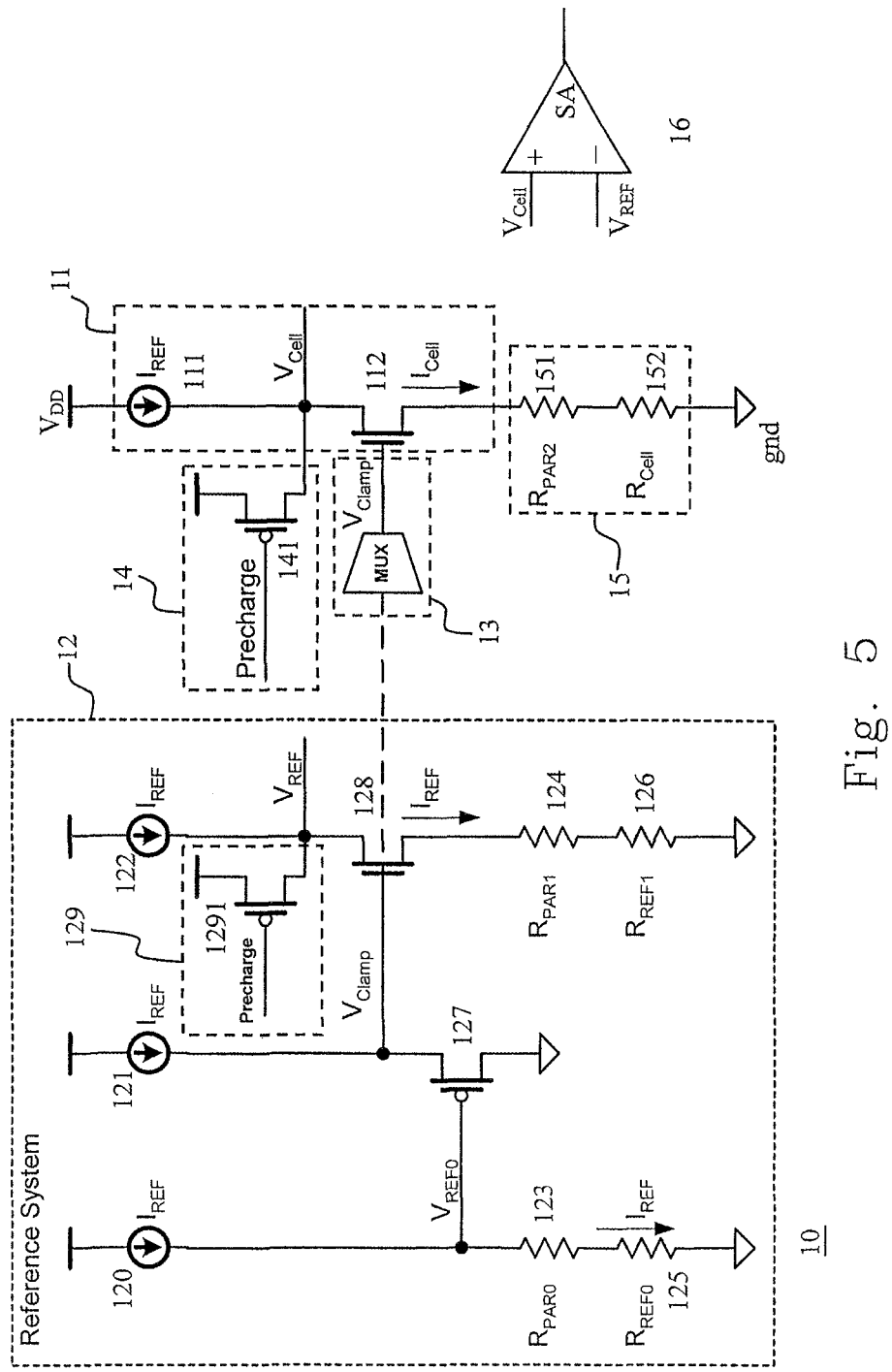
FIG. 5 is a circuit diagram of an embodiment of the PCM in the present invention.

FIG. 5 is a circuit diagram of an embodiment of the PCM in the present invention. As shown in FIG. 5, a phase change memory 10 includes a current supplying circuit 11, a reference system circuit 12, multiplexer (MUX) 13, a pre-charge circuit 14, a phase change memory cell 15 and a sense amplifier (SA) 16.

The current supplying circuit 11 preferably includes a current 11 and an n-type Metal-Oxide-Semiconductor Field-Effect Transistor (MOSFET) 112, wherein a terminal of the current source 111 is coupled to a first supply reference voltage, such as the supply voltage $V_{DD}$, another terminal of the current source 111 is coupled to the drain terminal of the n-type MOSFET (NMOS) 112, the source terminal of the NMOS 112 is coupled to the phase change memory cell 15, and the phase change memory cell 15 is coupled to a second supply reference voltage, such as the ground gnd. The elements 151 and 152 represent the equivalent parasitic resistance and cell resistance.

The pre-charge circuit 14 has an input terminal and an output terminal. The input terminal receives a pre-charge trigger signal in order to trigger the pre-charging. The output terminal is coupled to the node at which a terminal of the current source 111 is coupled to the drain terminal of the NMOS 112. The pre-charge circuit 14 includes a p-type MOSFET (PMOS) 141. The source terminal of the PMOS 141 is coupled to the first supply reference voltage, the gate terminal of the PMOS 141 is the input terminal of the pre-charge circuit 141, and the drain terminal of the PMOS 141 is the output terminal of the pre-charge circuit 141.

The pre-charge trigger signal will trigger the PMOS 141 in the pre-charge circuit 14, and charge the voltage at the drain terminal of the NMOS 112 toward the first supply reference voltage, such as $V_{DD}$, during a certain amount of time in advance in order to reduce the set up time of the memory cell path. The current $I_{Ref}$ provided by the current source 111 raises the voltage of the drain terminal of the NMOS 112 while the current $I_{Cell}$ passing through the NMOS 112 pulls down the voltage of the drain terminal of the NMOS 112. When reaching the steady state, the node at the drain terminal of the NMOS 112 develops a steady voltage as the cell voltage $V_{Cell}$ in FIG. 5

The reference system circuit 12 includes current sources 120, 121 and 122, parasitic resistors 123 and 124, reference resistors 125 and 126, a PMOS 128, an NMOS 128 and a pre-charge circuit 129, wherein the cell voltage is obtained at a node where the second terminal of the first current source is coupled to the first terminal of the first MOSFET, and the clamp voltage is provided to the gate of the gate of the first MOSFET.

A terminal of the current source 120 is coupled to the first supply reference voltage. The other terminal of the current source 120 is coupled to the terminal of the parasitic resistor 123 and the gate terminal of the PMOS 127. The other terminal of the parasitic resistor 123 is coupled to a terminal of the reference resistor 125. The other terminal of the reference resistor 125 is coupled to the second supply reference voltage.

A terminal of the current source 121 is coupled to the first supply reference voltage. The other terminal of the current source 121 is coupled to the source terminal of the PMOS 127 and the gate terminal of the NMOS 128. The drain terminal of the PMOS 127 is coupled to the second supply reference voltage.

A terminal of the current source 122 is coupled to the first supply reference voltage. The other terminal of the current source 122 is coupled to the drain terminal of the NMOS 128. The source terminal of the NMOS 128 is coupled to a terminal of the parasitic resistor 124. The other terminal of the parasitic resistor 124 is coupled to a terminal of the reference resistor 126. The other terminal of the reference resistor 126 is coupled to the second supply reference voltage.

The pre-charge circuit 129 has an input terminal and an output terminal. The input terminal receives a pre-charge trigger signal in order to trigger the pre-charging. The output terminal is coupled to the node at which a terminal of the current source 122 is coupled to the drain terminal of the NMOS 128. The pre-charge circuit 129 includes a PMOS 1291. The source terminal of the PMOS 1291 is coupled to the first supply reference voltage. The gate terminal of the PMOS 1291 is the input terminal of the pre-charge circuit 129, and the drain terminal of the PMOS 1291 is the output terminal of the pre-charge circuit 129. The node, at which a terminal of the current source 122 is coupled to the drain terminal of the NMOS 128, is the output terminal of the reference system circuit 12 outputting a reference voltage $V_{Ref}$.

Each of the current sources 120, 121 and 122 in the reference system circuit 12 provides the same current $I_{Ref}$. The $I_{Ref}$ passes through the parasitic 123 and the reference resistor 125 and causes a voltage drop thereby provides a voltage $V_{Ref0}$ at the gate terminal of the PMOS 127. The voltage $V_{Ref0}$ determines the amount of the current passing through the PMOS 127. The current $I_{Ref}$ provided by the current source 121 will raise the voltage of the drain terminal of the PMOS 127 while the current $I_{cell}$ passing through the p-type MOSFET 127 will pull down the voltage of the drain terminal of the PMOS 127. Finally, the node at the gate terminal of the NMOS 128 will develop a steady voltage and become the clamp voltage $V_{Clamp}$ generated by the reference system circuit 12.

The pre-charge trigger signal triggers the PMOS 1291 in the pre-charge circuit 129, and charge the voltage at the drain terminal of the NMOS 128 toward the first supply reference voltage, such as $V_{DD}$, during a certain amount of time in advance in order to reduce the set up time of the memory cell path. Then, the current $I_{REF}$ provided by the current source 122 raises the voltage of the drain terminal of the NMOS 128 while the current $I_{Cell}$ passing through the NMOS 128 pulls down the voltage of the drain terminal of the NMOS 128. When reaching the steady state, the node at the drain terminal of the NMOS 128 develops a steady voltage as the reference voltage $V_{Ref}$ in FIG. 5.

The clamp voltage can be optionally provided to the gate of the NMOS 112 through a MUX 13 so that, under the required condition, the clamp voltage generated by another reference system circuit can be chosen through the MUX 13.

The NMOSs 128 and 112 both work in the saturation region. Therefore, the clamp voltage $V_{Clamp}$ dominates the $V_{Ref}$ and $V_{Cell}$ to limit the $V_{Cell}$ to avoid disturbance.

The aforementioned generated cell voltage $V_{Cell}$ and reference voltage $V_{Ref}$ are inputted to the sense amplifier 16. Similar to the traditional the cell voltage $V_{Cell}$ is compared with the reference voltage $V_{Ref}$, which is a criterion, so as to determine the data state stored in the PCM cell 15, such as 1 or 0 for single level cell. Preferably, the SA 16 can be implemented by using a comparator or an operational amplifier.

Figure 6:
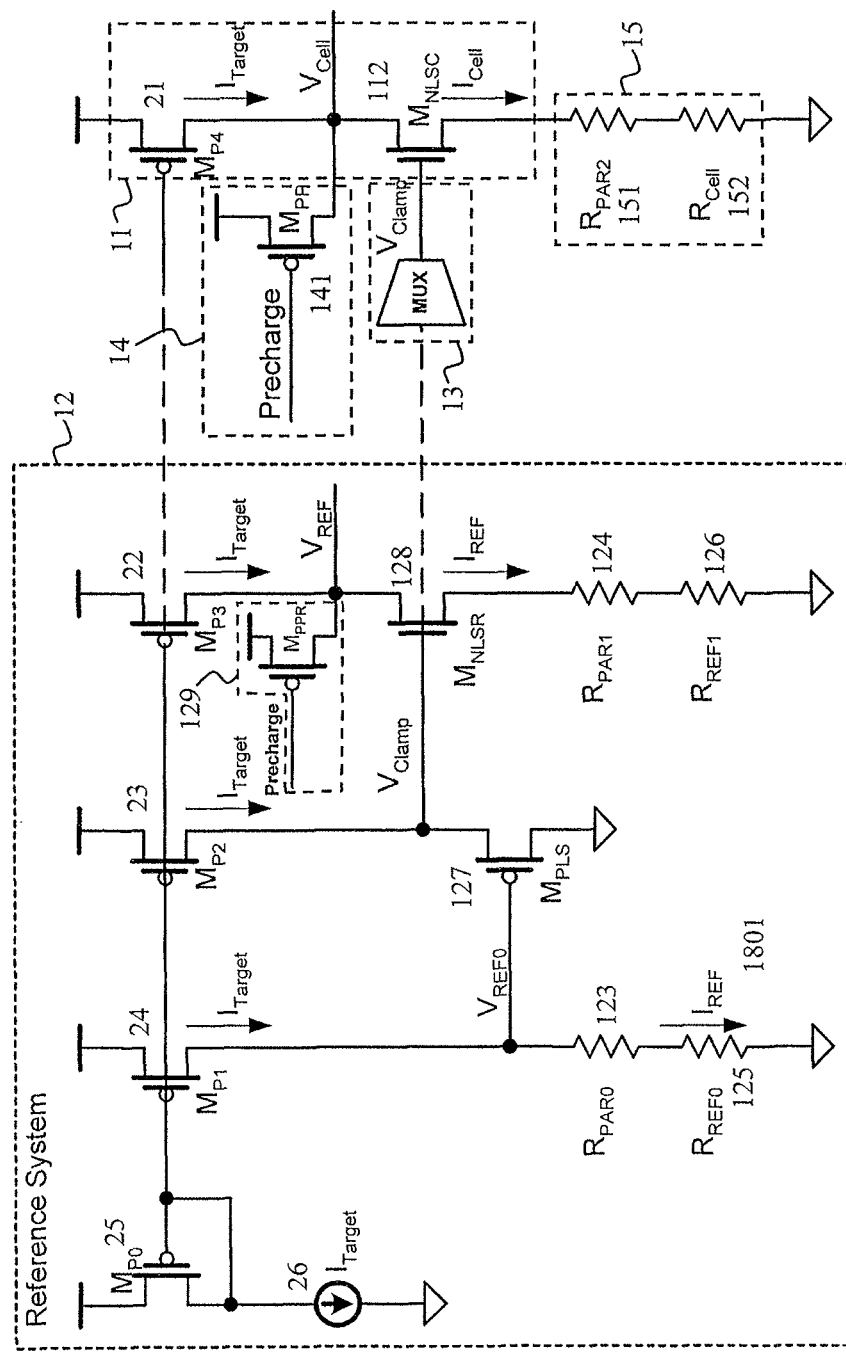
FIG. 6 illustrates another embodiment of the present invention.

The current $I_{Ref}$ generated by the aforementioned current sources 111, 120, 232 and 122 can also be generated by using the structure of current mirror. Please refer to FIG. 6, which illustrates another embodiment of the present invention. The PMOSs 22, 23, 24 and 25 and the current source 26 form a current mirror structure. The current source 26 generates a target current $I_{Target}$, which is respectively mirrored by the PMOSs 22, 23, 24 and 25 so as to generate the $I_{Ref}$ identical to the $I_{Target}$. Same as the previous embodiment, the chosen target current $I_{Target}$ is generated for developing the clamp voltage $V_{Clamp}$ and the reference voltage $V_{Ref}$. The clamp voltage $V_{Clamp}$ and the reference voltage $V_{Ref}$ are used for the memory cell for creating the cell signal $I_{Cell}$ and $V_{Cell}$.

For acquiring matching scheme for better device tracking in this embodiment, the configuration for the elements is preferable to be divided into the following groups: PMOSs 21, 22, 23, 24 and 25 are identical to one another; the resistance values of the parasitic resistors 123, 124 and 151 are identical to one another; the resistance values of the reference resistors 125 and 126 are identical to each another; NMOSs 128 and 112 are identical to each another.

For MLC application, repeating sensing with different references is adapted. The idea is: selecting a wanted $I_{REF}$, then, as mentioned above, the $V_{Clamp}$ and $V_{Ref}$ generated according to the value of $R_{REF0}$ and $R_{REF1}$, the higher $R_{REF0}$ and $R_{REF1}$ get the higher $V_{Clamp}$ and $V_{Ref}$. This method increases cell current (also sensing window) of high resistance cells. The stepping up for $V_{Clamp}$ is stopped to be adapted on those cells which are already knew with lower resistance than reference for avoiding disturbance.

Figure 7:
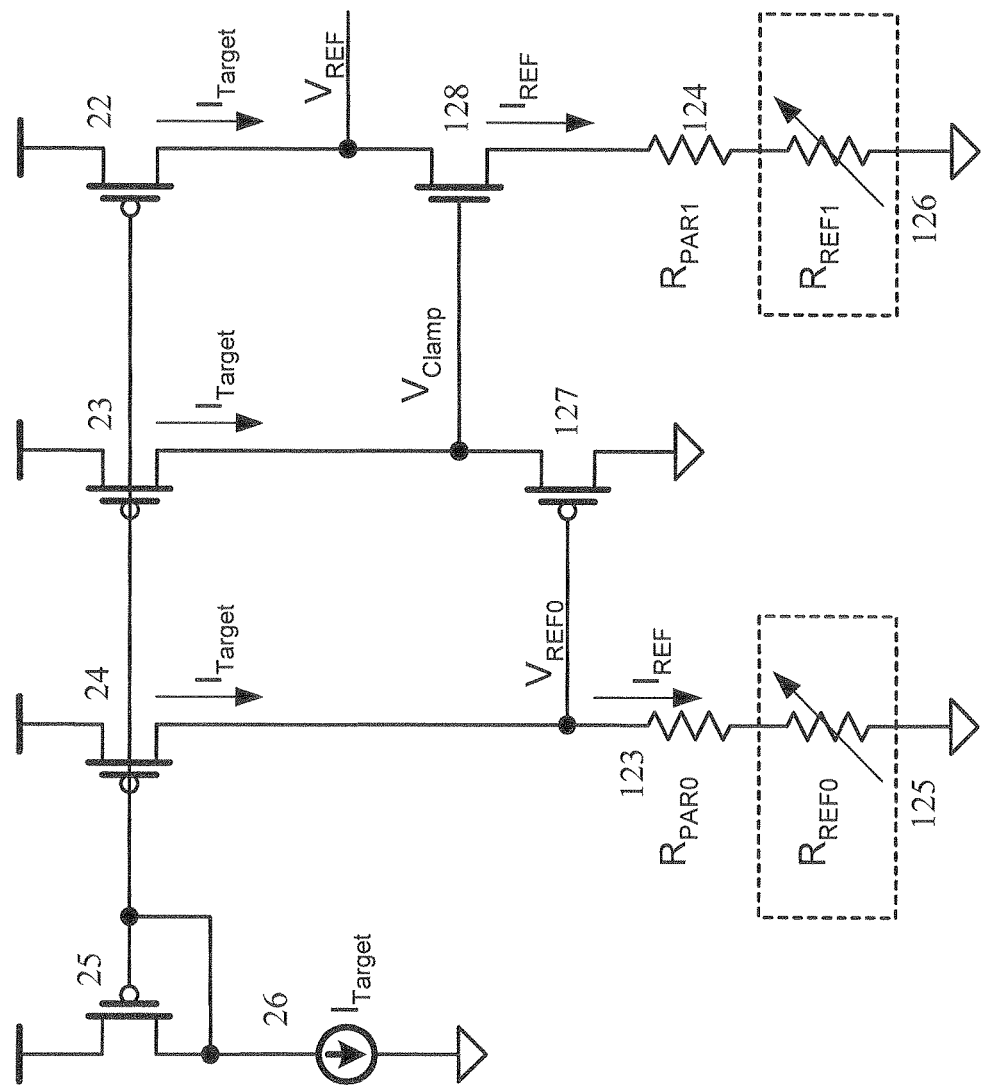
FIG. 7 illustrates a circuit diagram wherein the reference resistors in the aforementioned embodiments can be replaced by variable resistors.

Please refer to FIG. 7, in the aforementioned embodiments, the reference resistors 125 and 126 can be replaced by variable resistors. The clamp voltage $V_{Clamp}$ and the reference voltage $V_{Ref}$ can be adjusted by varying the variable resistors.

Figure 8:
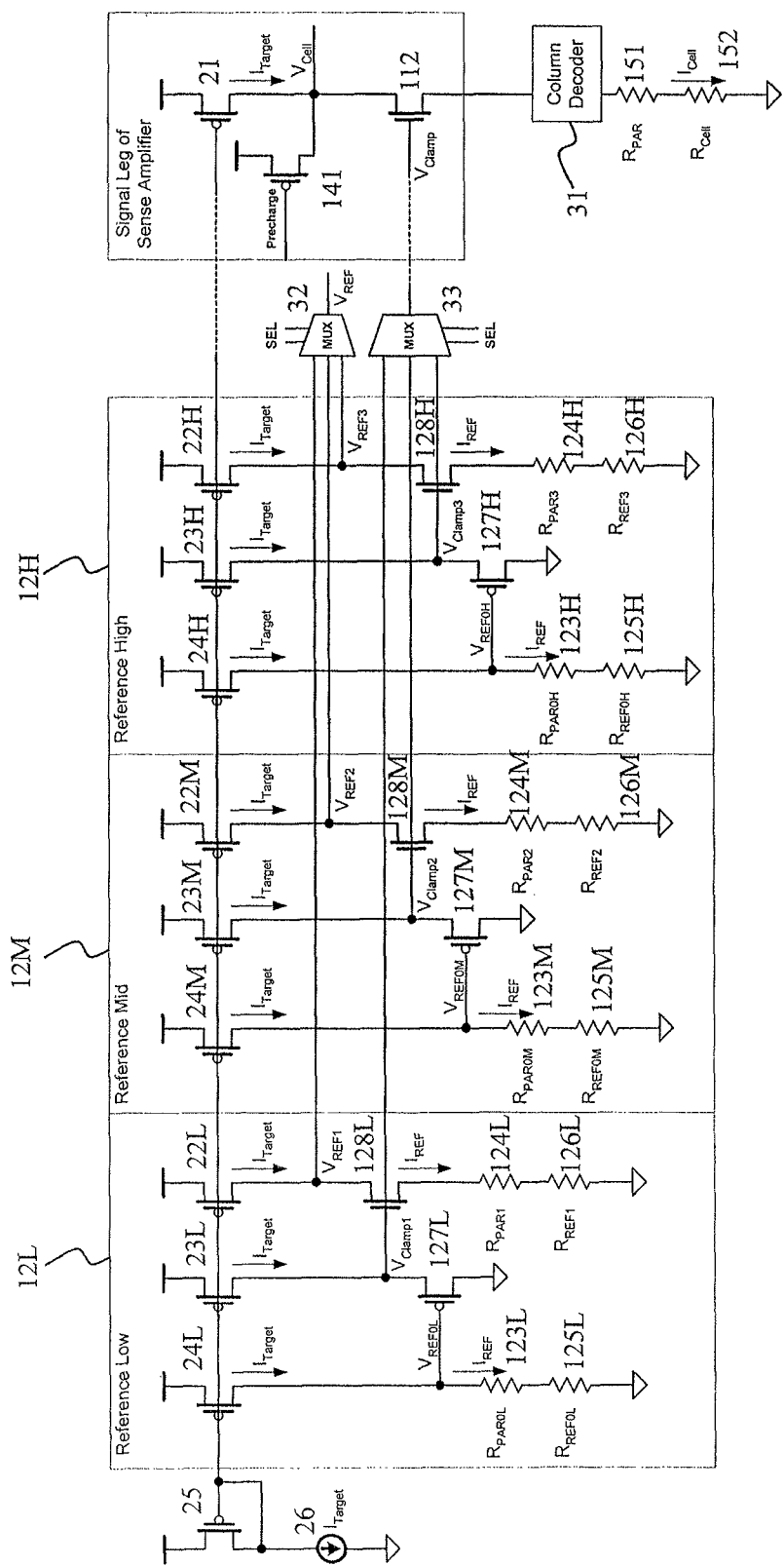
FIG. 8 is a circuit diagram of yet another embodiment of the present invention.
Figure 9:
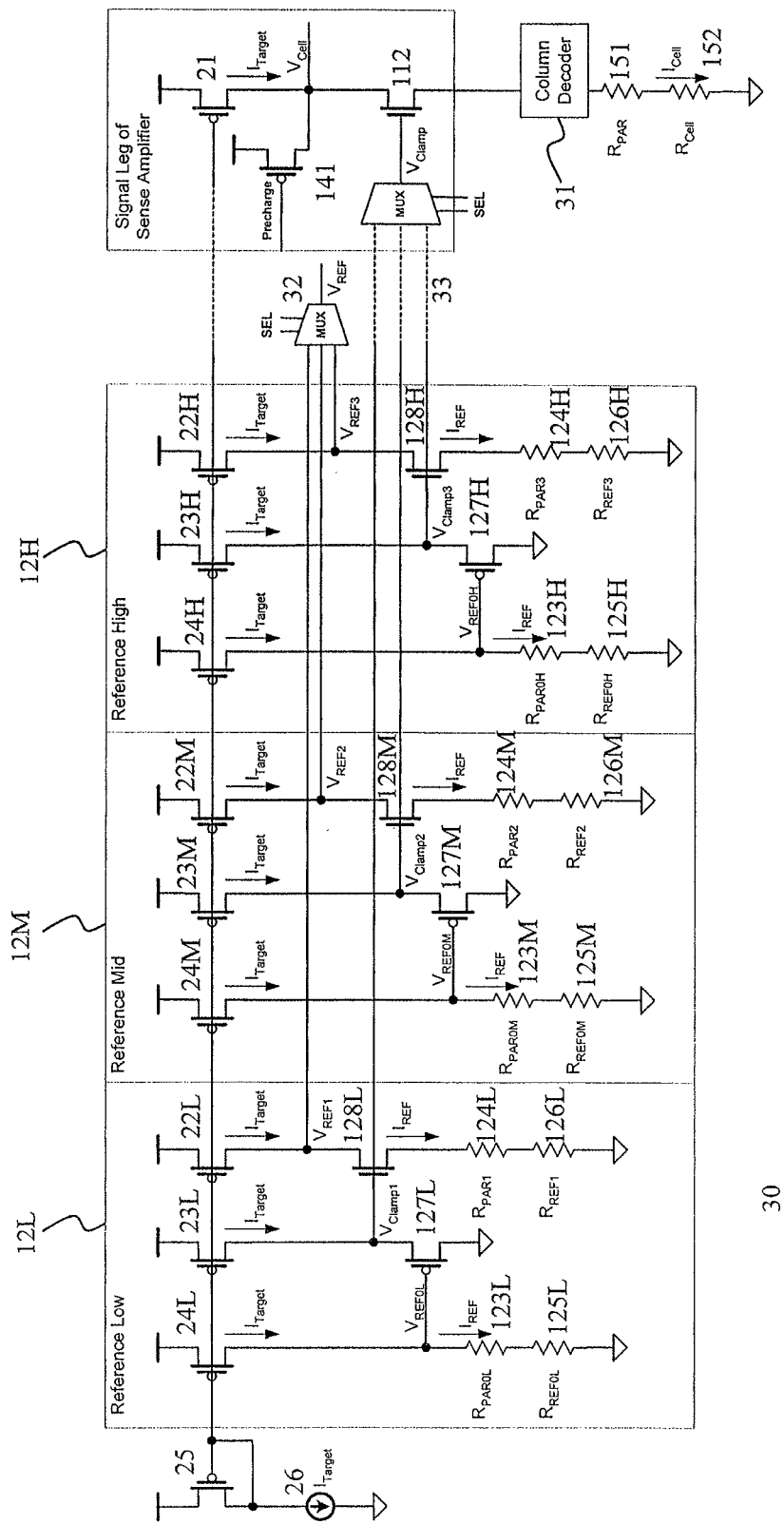
FIG. 9 is a circuit diagram placing the multiplexer (MUX) right next to the sense amplifier (SA).

Please refer to FIG. 8, which is a circuit diagram of yet another embodiment of the present invention, illustrating three sets of reference sub-system for 4 states MLC application. In FIG. 8, the PCM 30 further includes reference sub-system circuits 12L, 12M and 12H, column decoder 31 and MUXs 32 and 33. At the upper right corner of FIG. 8, there is a signal path of the sense amplifier. The connection and operation of each of the reference sub-system circuits is in accordance with that of the reference system circuit 12 in the PCM 20 in FIG. 6. The column decoder 31 works in accordance with the column decoder in the prior art, which chooses the bit line to be read when reading the memory data. The reference sub-system circuits 12L, 12M and 12H are respectively configured with lower reference resistors, middle reference resistors and higher reference resistors. As above mentioned, configuring a reference resistor with lower resistance generates a lower clamp voltage and configuring a reference resistor with higher resistance generates a higher clamp voltage. Therefore, the reference sub-system 12H generates a lower clamp voltage $V_{Clamp1}$ and a lower reference voltage $V_{Ref1}$, the reference sub-system 12H generates a higher clamp voltage $V_{Clamp3}$ and a higher reference voltage $V_{Ref3}$, and the reference sub-system 12M generates a clamp voltage $V_{Clamp2}$ between the clamp voltage $V_{Clamp1}$ and the clamp voltage $V_{Clamp3}$, and a reference voltage $V_{Ref2}$ between the reference voltage $V_{Ref1}$ and the reference voltage $V_{Ref3}$. The MUXs 32 and 33 is controlled by the SEL signal for controlling to choose the clamp voltage and the reference voltage being sent to the back end SA. The MUXs 32 and 33 could place right next to the reference system circuit, right next to the SA or any point between the path of the reference system and the SA. FIG. 9 is a circuit diagram placing the MUX 33 right next to the SA. In practice, the location for the MUXs depends on the trade-off between speed and area.

Figure 10:
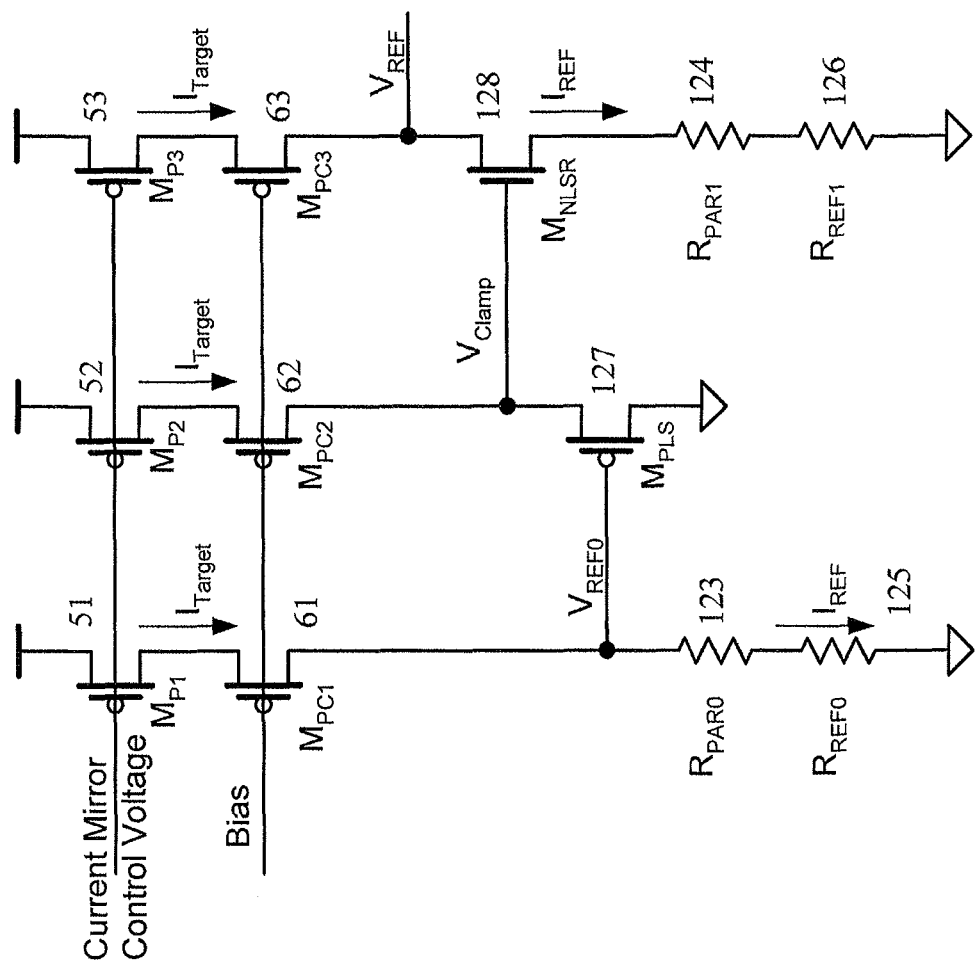
FIG. 10 shows a part of the reference system circuit in the present invention, in which a cascode structure is involved.

Passing the same controlled target current for better tracking between the reference system circuit and the memory cell is important. Any kind of technique like cascode can be involved to have the target current be identical within reference system and also memory cell. FIG. 10 shows a part of the reference system circuit in the present invention, in which a cascode structure is involved and includes PMOSs 51, 52, 53, 61, 62 and 63. Each of the gates thereof receives the current mirror control voltage signal and the bias signal. The target current $I_{Target}$ on each of the three current path in this figure is identical to one another by such a structure.

Figure 11:
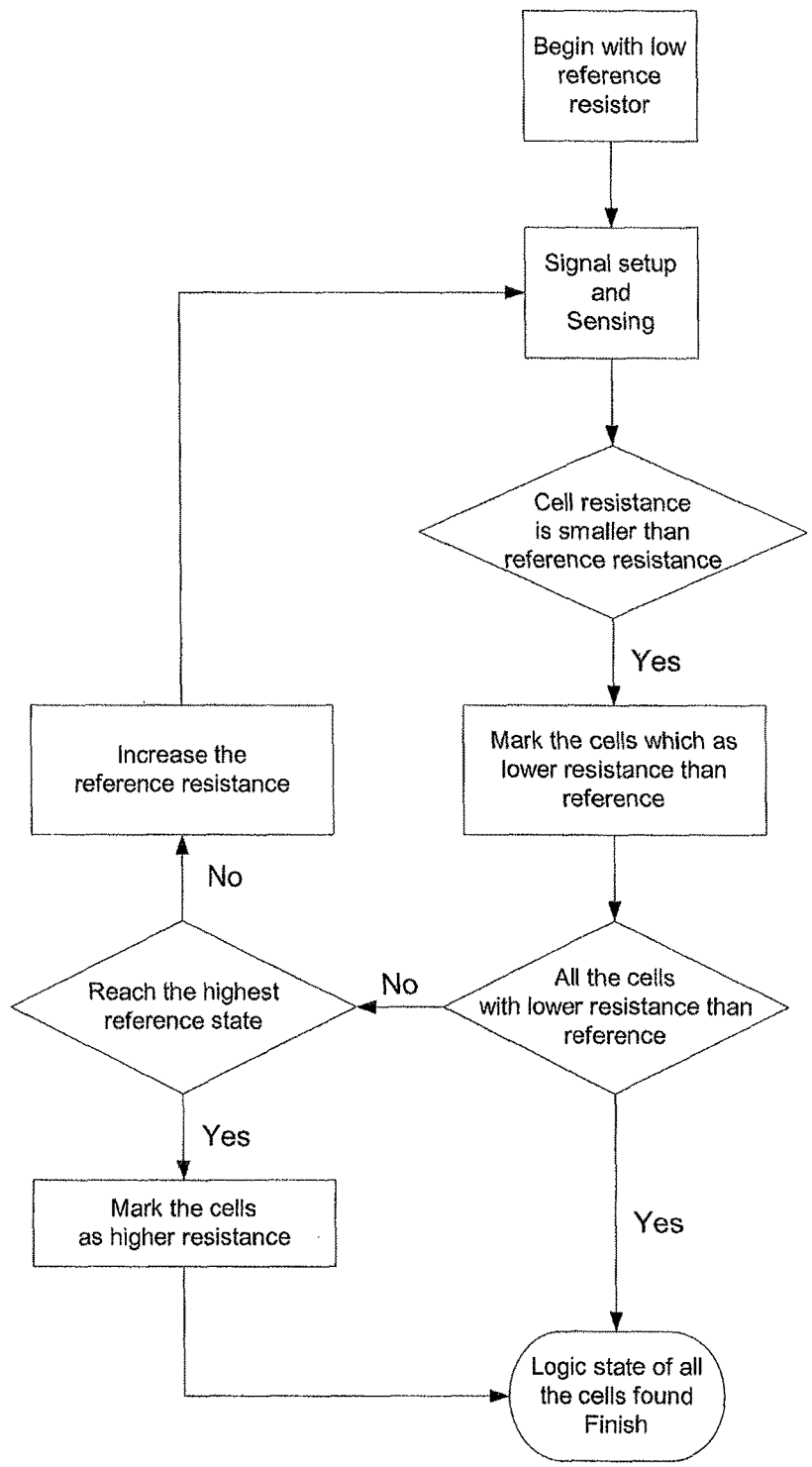
FIG. 11 represents the flow chart illustrating an example while margin search.

The rule of thumb of avoiding cell disturbance in multiple sensing such as margin check and MLC is always begin with low reference resistor. The cell has been verified as lower than the reference is marked and blocked from the next higher reference sensing. FIG. 11 represents the flow chart illustrating an example while margin search. The value and range of reference, which is usually from several kilo-ohm to several mega-ohm, is highly related to the type of PCM material. For example if the sensing process begins with 100 k-ohm reference resistor and 1 uA of target reference current, it results in a 0.1V voltage on BL which is not going to disturb the cell. Once the cell has been verified with lower resistance than current reference resistance, the information is stored in the registers which can be used for blocking the next sensing since this next sensing involves higher bit line signal which causes disturbance.

Figure 12:
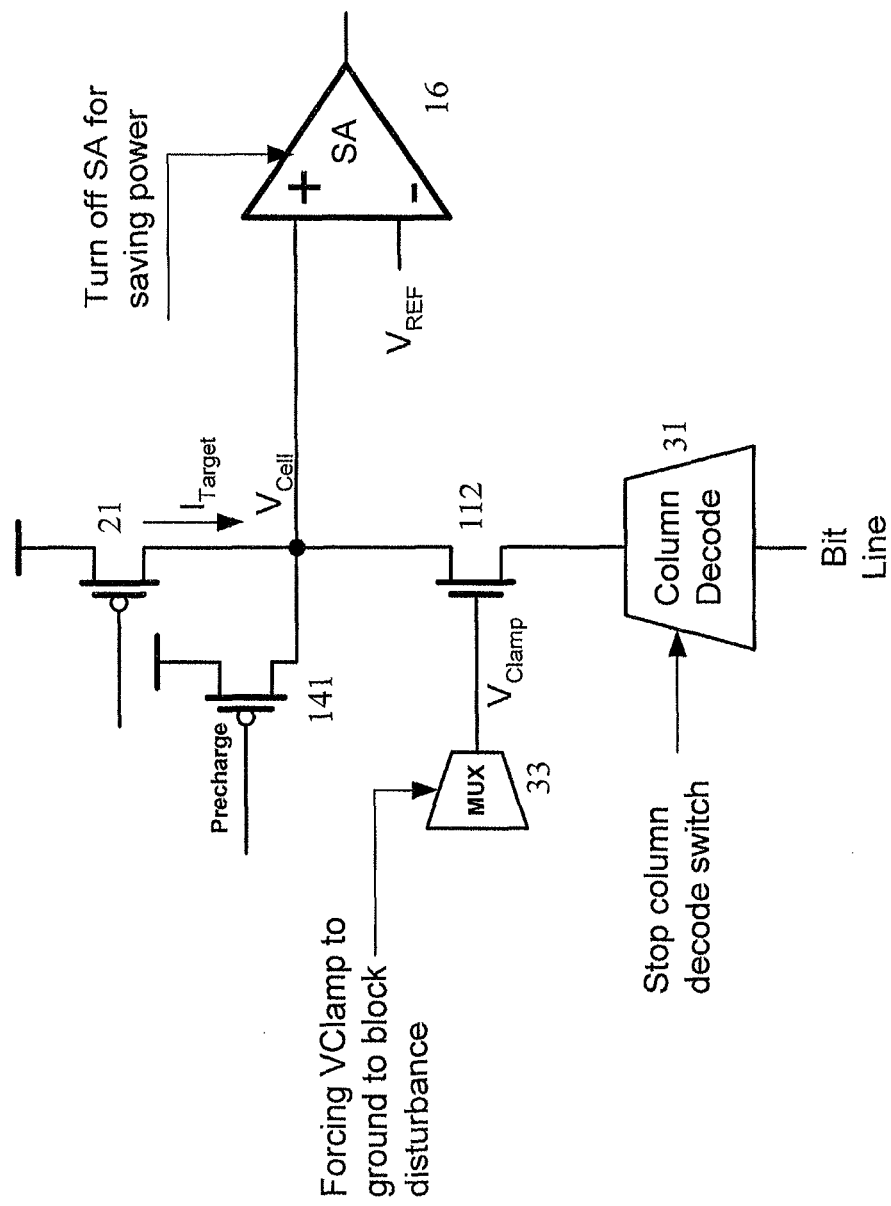
FIG. 12 shows a part of the PCM circuit in the present invention.

Also the stored information can be further used to turn off SA or decoder for saving power and blocking any unwanted signal switching. FIG. 12 shows a part of the PCM circuit in the present invention. This Figure shows a way of changing the resistance of reference. As shown in this figure, the stored information can be used for sending turn off and stop signal to the SA 16 and the column decoder 31, and sending signal to force the clamp voltage $V_{Clamp}$ to ground to block the disturbance resulted from higher bit line signal.

Figure 13:
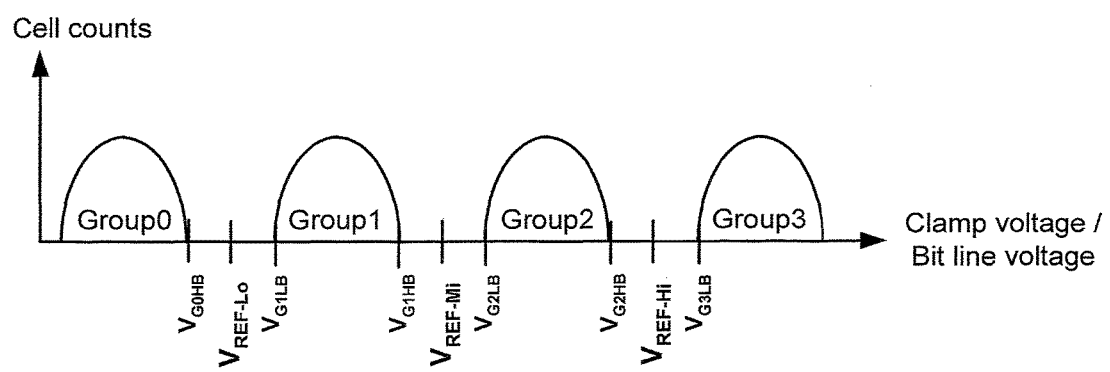
FIG. 13 illustrates the steps, in the MLC application, for searching maximum windows between each state of the PCM and determining the best spot of $V_{REF-Lo}$, $V_{REF-Mi}$ and $V_{REF-Hi}$.

Please refer to FIG. 13, which illustrating the steps, in the MLC application, for searching maximum windows between each state of the PCM and determining the best spot of $V_{Ref-Lo}$, $V_{Ref-Mi}$ and $V_{Ref-Hi}$. Step 1: Sweep through all the range of $V_{Clamp}$ to get the boundary of each group; Step 2: Find boundary $V_{G0HB}$, $V_{G1LB}$, $V_{G1HB}$, $V_{G2LB}$, $V_{G2HB}$ and $V_{G3LB}$, and record boundary information in registers; Step 3: Use the information obtained from Step2 to determine best reference spot ($V_{Ref-Lo}$, $V_{Ref-Mi}$, and $V_{Ref-Hi}$) for each group.

Figure 14:
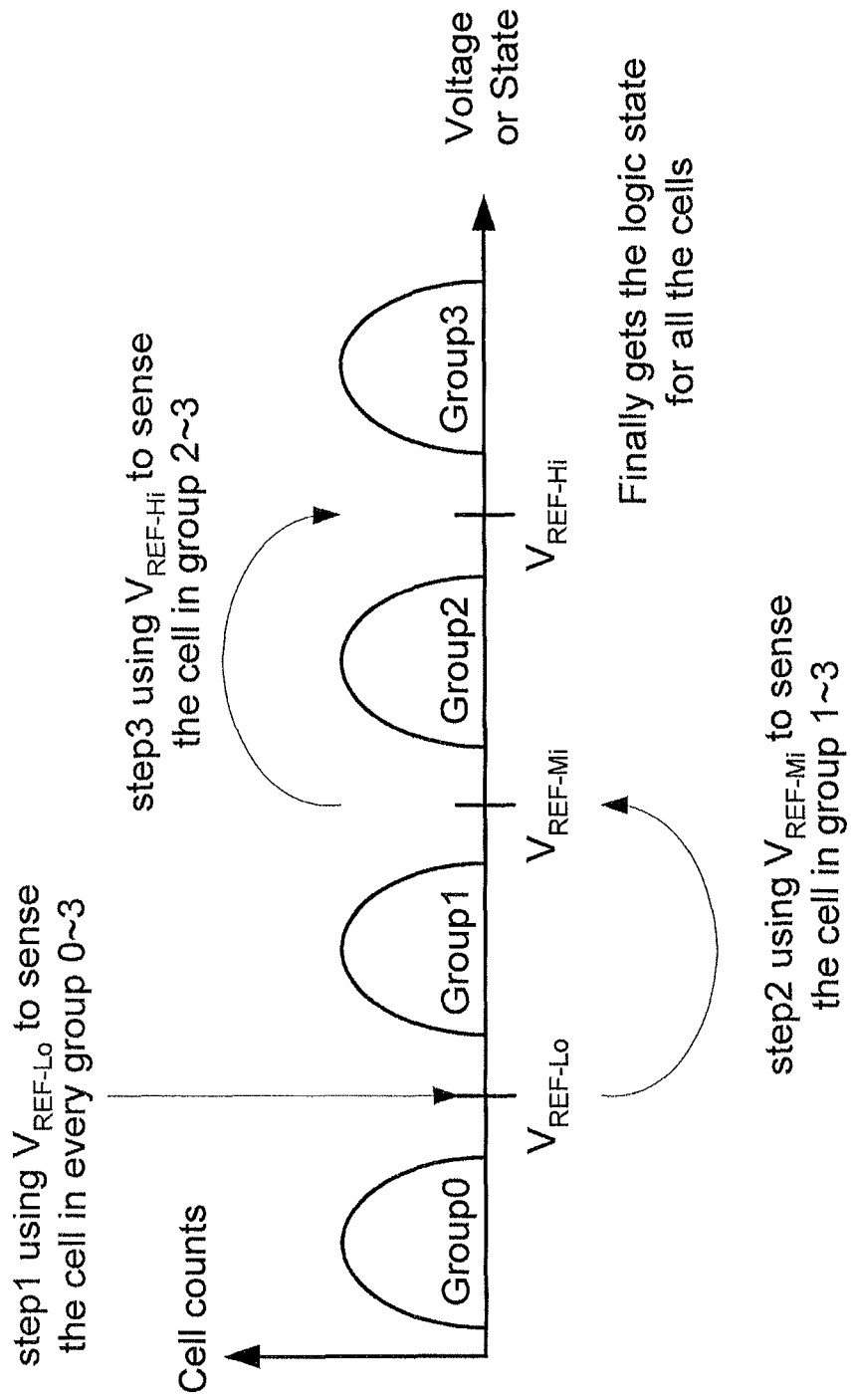
FIG. 14 illustrates a way of MLC sensing.

In the following, FIG. 14 illustrates a way of MLC sensing. Step1: Use $V_{Ref-Lo}$ to sense all the cells in Group 0, if all the cells in Group 0 been verified as lower than $V_{Ref-Lo}$ state, then mark and block the cells in Group 0 so that they won't get disturbed during next higher bit line voltage sensing; Step 2: Change the reference voltage to $V_{Ref-Mi}$, use $V_{Ref-Mi}$ to sense the cells in group 1~3, and mark and block Group 1 cells for avoiding disturbance too; Step 3: Change the reference voltage to $V_{Ref-Hi}$, use $V_{Ref-Hi}$ to sense the cells in group 2~3, and find which cells in Group2 or Group3 and get the logic state for all the cells. Finish the process.

Figure 15:
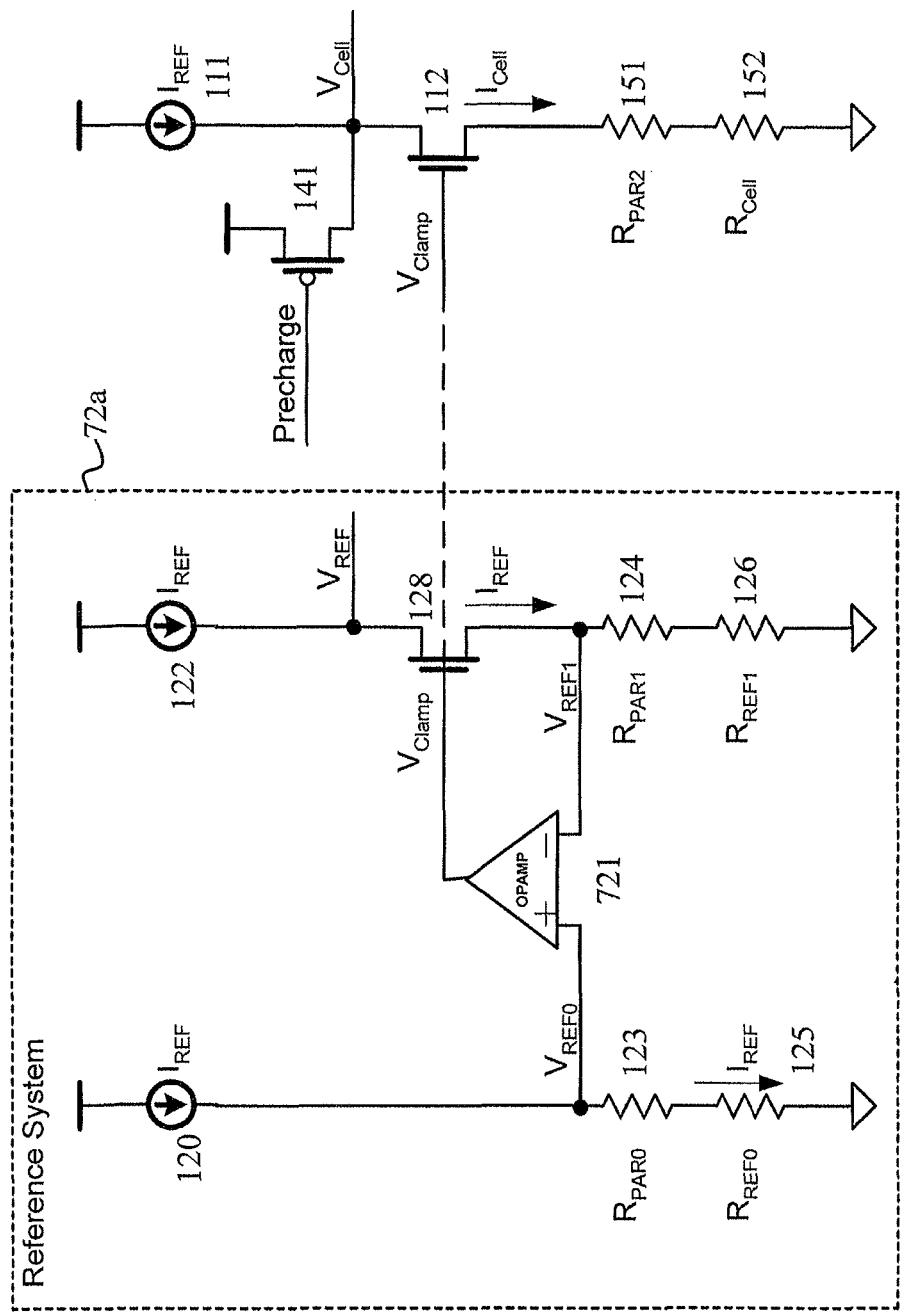
FIG. 15 is a further circuit embodiment of the reference system circuit of the PCM in FIG. 5 of the present invention.

FIG. 15 is a further circuit embodiment of the reference system circuit of the PCM in FIG. 5 of the present invention, in which a negative feedback operational amplifier (OPAMP) 721 is adapted for virtual shorting $V_{Ref0}$ and $V_{Ref1}$. This idea forces $V_{Ref0}=V_{Ref1}$ regardless of the element characteristics owing to the process corner variation. Besides, this OPAMP 721 could apply higher driver ability for enhancing the setting up speed of $V_{Clamp}$ node.

Figure 16:
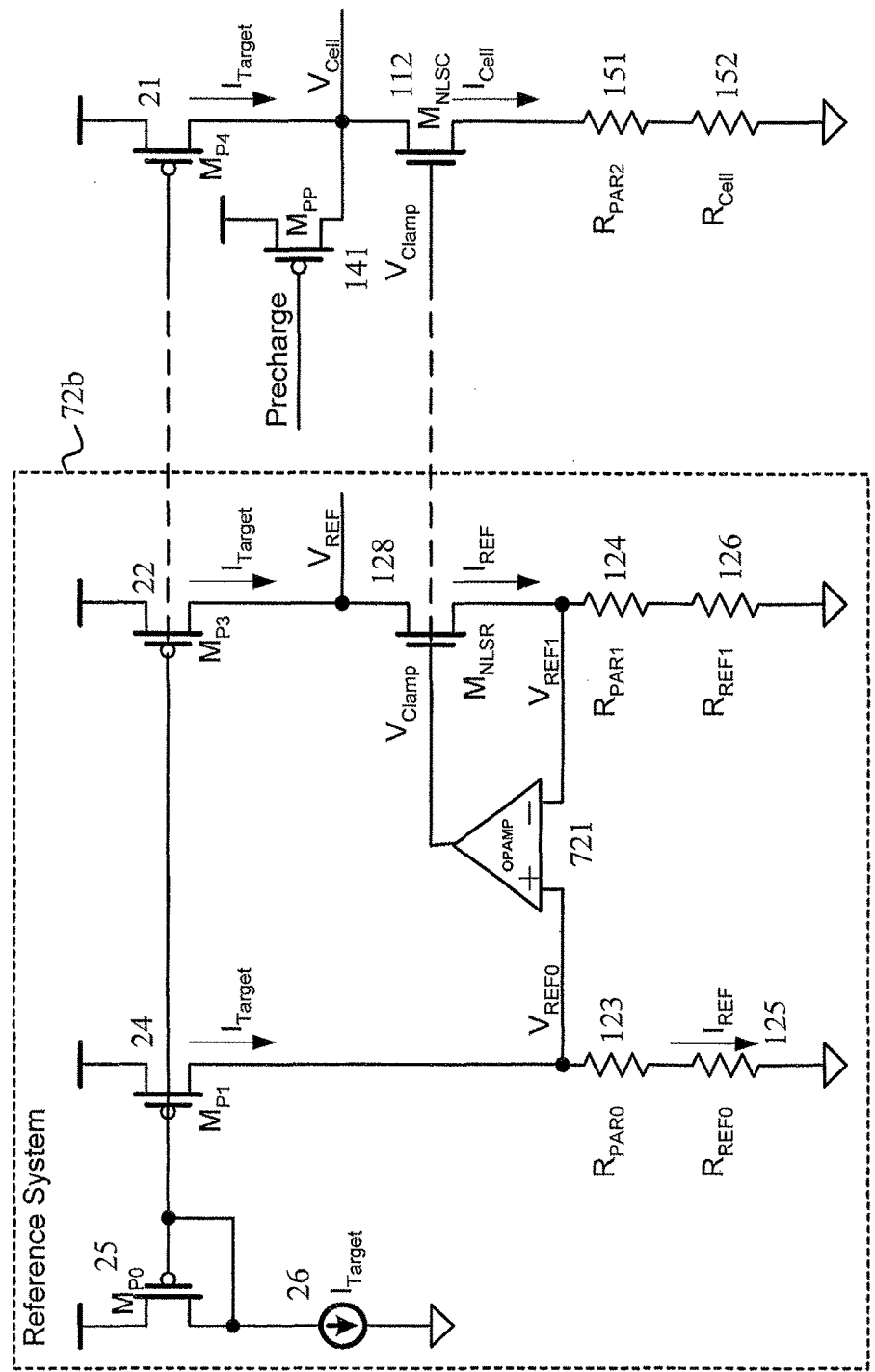
FIG. 16 illustrates a further embodiment of the reference system circuit of the PCM in FIG. 6.

The negative feedback OPAMP can also be adapted to other embodiments in the present invention. For example, FIG. 16 illustrates a further embodiment of the reference system circuit of the PCM in FIG. 6, in which a negative OPAMP 721 is adapted for virtual shorting $V_{Ref0}$ and $V_{Ref1}$. This idea forces $V_{Ref0}=V_{Ref1}$ regardless of the element characteristics owing to the process corner variation. Besides, this OPAMP 721 could apply higher driver ability for enhancing the setting up speed of $V_{Clamp}$ node.

Figure 17:
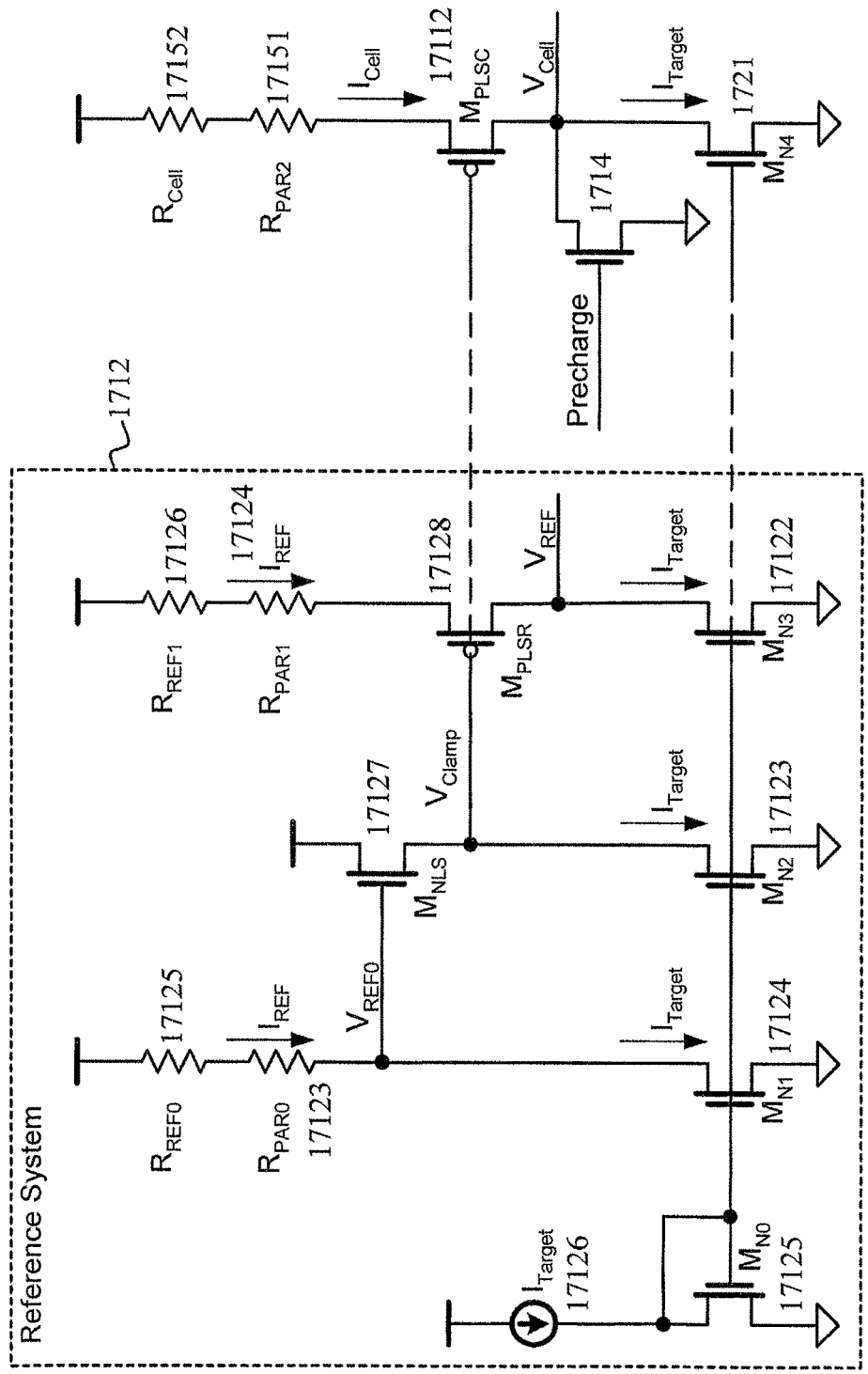
FIG. 17 illustrates an embodiment adapting the NMOS current mirror as a current source to apply the target current $I_{Target}$.

In addition, depending on the type of the memory cell, the present invention is also good for NMOS current mirror for passing $I_{Target}$ all over the chip. FIG. 17 illustrates an embodiment adapting the NMOS current mirror as a current source to apply the target current $I_{Target}$. The PCM 170 includes NMOSs 1714, 1721, 1722, 1723, 1724, 1725 and 1727, PMOSs 17112 and 17128, a current source 1726, parasitic resistors 17123, 17124 and 17151, reference resistors 17125 and 17126, and a cell resistor 17152. The connection relationship thereof is as shown in FIG. 17. The generation, operation and adjustment of the signal path, the reference resistors, the clamp voltages and the reference voltages are similar to the aforementioned embodiments.

Figure 18:
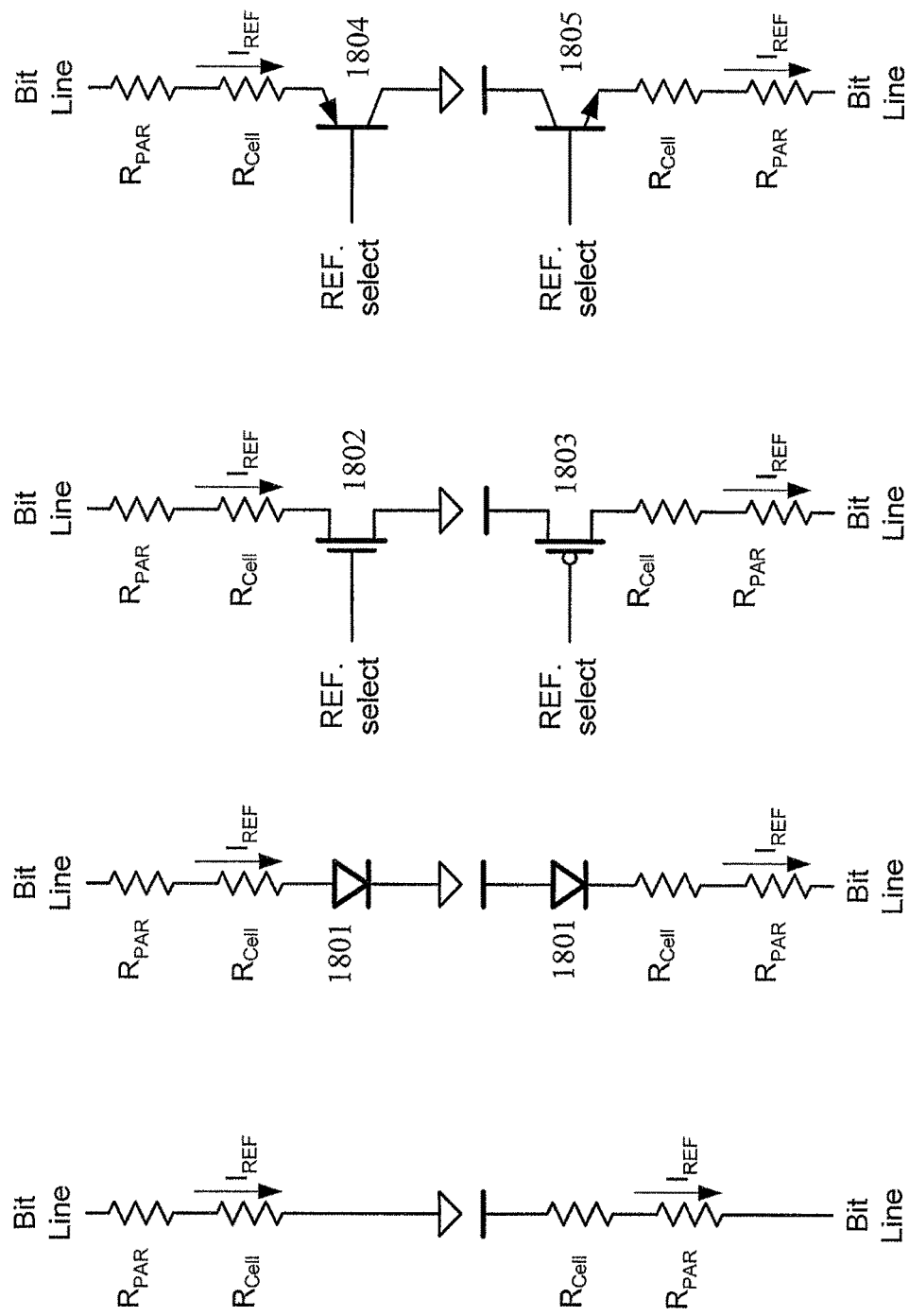
FIG. 18 illustrates some types of the phase change memory cell that could be applied in the present invention.
Figure 19:
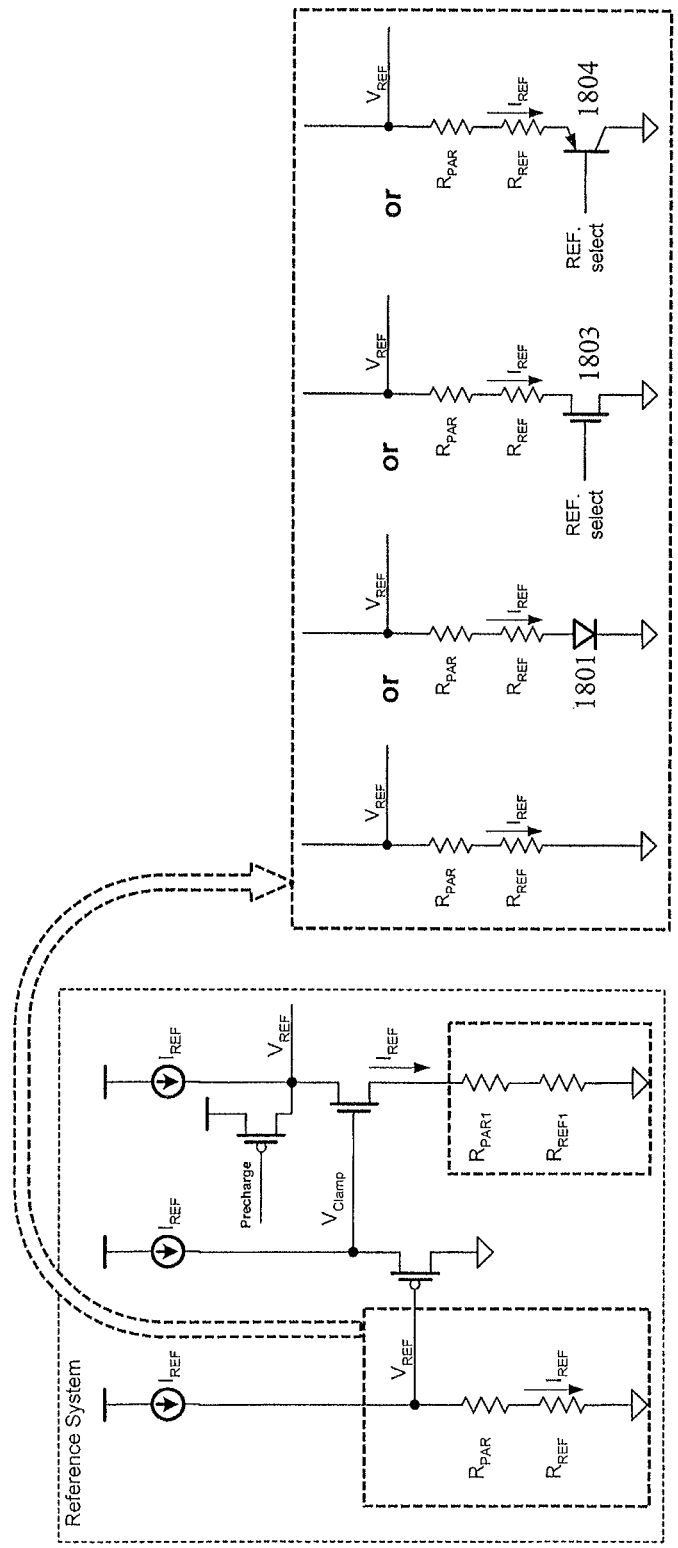
FIG. 19 illustrates an embodiment for the reference system circuit.

The present invention could be very easy applied to any kind of PCM array structure. As shown in FIG. 18, some types of the phase change memory cell are listed, in which $R_{PAR}$ represents for the parasitic resistor, $R_{Cell}$ represents for the cell resistor. The reference numeral 1801 represents for diode, the reference numeral 1802 represents for NMOS, the reference numeral 1803 represents for PMOS, and the reference numerals 1804 and 1805 represents for bipolar junction transistor (BJT). As shown in FIG. 19, the type of reference resistors is variable too. For example, if the driving cell is a MOSFET the reference is better with a MOSFET plus a resistor. Also the type of resistor is usually a passive device, for example a poly resistor.

EMBODIMENTS

Embodiment 1

A memory includes a memory cell, a reference circuit and a current supplying circuit. The reference circuit generates a reference voltage and a clamp voltage. The current supplying circuit receives the clamp voltage to develop a cell current passing through the memory cell to form a cell voltage. The cell voltage is used for incorporating with the reference voltage to determine an information stored in the memory.

Embodiment 2

In the structure according to above-mentioned embodiment, the memory further includes: a first supply reference voltage and a second supply reference voltage. The current supplying circuit includes: a first current source and a first MOSFET. The first current source has a first terminal and a second terminal. The first MOSFET has a first terminal, a second terminal and a gate terminal. The first terminal of the first MOSFET receives the first supply reference voltage. The second terminal of the first current source is coupled to the first terminal of the first MOSFET. The second terminal of the first MOSFET is coupled to the memory cell. The cell voltage is obtained at a node where the second terminal of the first current source is coupled to the first terminal of the first MOSFET. The clamp voltage is provided to the gate of the first MOSFET.

Embodiment 3

In the structure according to any one of the above-mentioned embodiment 1 or 2, the memory further includes a first pre-charge circuit. The first pre-charge circuit has a first output terminal coupled to one of the second terminal of the first current source and the first terminal of the first MOSFET.

Embodiment 4

In the structure according to any one of the above-mentioned embodiment 1-3, the reference circuit further generates a reference current, and includes a second, a third and a fourth current sources, a first and a second parasitic resistors, a first and a second reference resistors, a second and a third MOSFETs, and a second pre-charge circuit. Each of the second, the third and the fourth current sources, the first and the second parasitic resistors, and the first and the second reference resistors has a first and a second terminals. Each of the second and the third MOSFETs has a first, a second and a gate terminal. The first terminal of the second current source receives the first supply reference voltage. The second terminal of the second current source is coupled to the first terminal of the first parasitic resistor and the gate terminal of the second MOSFET. The second terminal of the first parasitic resistor is coupled to the first terminal of the first reference resistor. The second terminal of the first reference resistor receives the second supply reference voltage. The first terminal of the third current source receives the first supply reference voltage. The second terminal of the third current source is coupled to the first terminal of the second MOSFET and the gate terminal of the third MOSFET. The second terminal of the second MOSFET receives the second supply reference voltage The first terminal of the fourth current source receives the first supply reference voltage. The second terminal of the fourth current source is coupled to the first terminal of the third MOSFET. The second terminal of the third MOSFET is coupled to the first terminal of the second parasitic resistor. The second terminal of the second parasitic resistor is coupled to the first terminal of the second reference resistor. The second terminal of the second reference resistor receives the second supply reference voltage. The second pre-charge circuit has a first output terminal coupled to one of the second terminal of the fourth current source and the first terminal of the third MOSFET. Each of the second, the third and the fourth current sources supplies a reference current. One of the second terminal of the fourth current source and the first terminal of the third MOSFET provides the reference voltage. One of the second terminal of the third current source and the first terminal of the second MOSFET provides the clamp voltage.

Embodiment 5

In the structure according to any one of the above-mentioned embodiment 1-4, each of the first, the second, the third and the fourth current sources is a current mirror circuit.

Embodiment 6

In the structure according to any one of the above-mentioned embodiment 1-5, the first pre-charge circuit includes a fourth MOSFET. The fourth MOSFET has a first, a second and a gate terminals. The first terminal of the fourth MOSFET receives the first supply reference voltage. The second terminal of the fourth MOSFET is the first output terminal of the first pre-charge circuit. The gate terminal of the fourth MOSFET receives a pre-charge trigger signal.

Embodiment 7

In the structure according to any one of the above-mentioned embodiment 1-6, the second pre-charge circuit includes a fifth MOSFET. The fifth MOSFET has a first, a second and a gate terminals. The first terminal of the fifth MOSFET receives the first supply reference voltage. The second terminal of the fifth MOSFET is the first output terminal of the second pre-charge circuit. The gate terminal of the fifth MOSFET receives the pre-charge trigger signal.

Embodiment 8

In the structure according to any one of the above-mentioned embodiment 1-7, the memory further includes a sense amplifier (SA). The SA receives the cell voltage and the reference voltage to determine the information stored in the memory.

Embodiment 9

In the structure according to any one of the above-mentioned embodiment 1-8, the memory, when applied to a multi-level cell (MLC) memory, further includes a second reference circuit. The second reference circuit generates a second reference current, a second reference voltage and a second clamp voltage. The clamp voltage is a first clamp voltage. The reference voltage is a first reference voltage. The first clamp voltage and the second clamp voltage are provided to the current supplying circuit through a first multiplexer (MUX) to develop a second cell current passing through the memory cell to develop a second cell voltage. One of the first and the second reference voltages is provided to the sense amplifier through a second MUX to be respectively compared with one of the first and the second cell voltages to determine the information stored in the memory.

Embodiment 10

In a method for reading a memory, the method includes: providing a memory cell, generating a reference voltage, a clamp voltage and a cell current. The cell current is generated based on the clamp voltage. The cell current passes through the memory cell to form a cell voltage. The cell voltage is used for incorporating with the reference voltage to determine an information stored in the memory.

Embodiment 11

In the method according to above-mentioned embodiment, the memory further includes a first supply reference voltage and a second supply reference voltage. The cell voltage is formed by a current supplying circuit. The current supplying circuit includes: a first current source, a first MOSFET. The first current source has a first terminal and a second terminal. The first MOSFET has a first terminal, a second terminal and a gate terminal. The first terminal of the first MOSFET receives the first supply reference voltage. The second terminal of the first current source is coupled to the first terminal of the first MOSFET. The second terminal of the first MOSFET is coupled to the memory cell. The cell voltage is obtained at a node where the second terminal of the first current source is coupled to the first terminal of the first MOSFET. The clamp voltage is provided to the gate of the first MOSFET.

Embodiment 12

In the method according to above-mentioned embodiment 10 or 11, the method further includes providing a first pre-charge circuit to reduce a set up time of the cell voltage.

Embodiment 13

In the method according to above-mentioned embodiment 10-12, the method further includes providing a reference circuit. The reference circuit generates a reference current, the reference voltage and the clamp voltage. The reference circuit includes: a second, a third and a fourth current sources, a first and a second parasitic resistors, a first and a second reference resistors, a second and a third MOSFETs, and a second pre-charge circuit. Each of the second, the third and the fourth current sources, the first and the second parasitic resistors, and the first and the second reference resistors has a first and a second terminals. Each of the second and the third MOSFETs has a first, a second and a gate terminals. The first terminal of the second current source receives the first supply reference voltage. The second terminal of the second current source is coupled to the first terminal of the first parasitic resistor and the gate terminal of the second MOSFET. The second terminal of the first parasitic resistor is coupled to the first terminal of the first reference resistor. The second terminal of the first reference resistor receives the second supply reference voltage. The first terminal of the third current source receives the first supply reference voltage. The second terminal of the third current source is coupled to the first terminal of the second MOSFET and the gate terminal of the third MOSFET. The second terminal of the second MOSFET receives the second supply reference voltage. The first terminal of the fourth current source receives the first supply reference voltage. The second terminal of the fourth current source is coupled to the first terminal of the third MOSFET. The second terminal of the third MOSFET is coupled to the first terminal of the second parasitic resistor. The second terminal of the second parasitic resistor receives the first terminal of the second reference resistor. The second terminal of the second reference resistor receives the second supply reference voltage. The second pre-charge circuit has a first output terminal coupled to one of the second terminal of the fourth current source and the first terminal of the third MOSFET. Each of the second, the third and the fourth current sources supplies a reference current. One of the second terminal of the fourth current source and the first terminal of the third MOSFET provides the reference voltage. One of the second terminal of the third current source and the first terminal of the second MOSFET provides the clamp voltage.

Embodiment 14

In the method according to above-mentioned embodiment 10-13, each of the first, the second, the third and the fourth current sources is a current mirror circuit.

Embodiment 15

In the method according to above-mentioned embodiment 10-14, the first pre-charge circuit is a fourth MOSFET. The fourth MOSFET has a first, a second and a gate terminals. The first terminal of the fourth MOSFET receives the first supply reference voltage. The second terminal of the fourth MOSFET is the first output terminal of the first pre-charge circuit. The gate terminal of the fourth MOSFET receives a pre-charge trigger signal.

Embodiment 16

In the method according to above-mentioned embodiment 10-15, the second pre-charge circuit is a fifth MOSFET. The fifth MOSFET has a first, a second and a gate terminals. The first terminal of the fifth MOSFET receives the first supply reference voltage. The second terminal of the fifth MOSFET is the first output terminal of the second pre-charge circuit. The gate terminal of the fifth MOSFET receives the pre-charge trigger signal.

Embodiment 17

In the method according to above-mentioned embodiment 10-16, the step of determining an information stored in the memory includes a step of comparing the cell voltage and the reference voltage to determine the information stored in the memory.

Embodiment 18

In the method according to above-mentioned embodiment 10-17, the method, when applied to a multi-level cell (MLC) memory, further includes a step of using a second reference circuit to generate a second reference current, a second reference voltage and a second clamp voltage. The clamp voltage is a first clamp voltage. The first and the second clamp voltages are provided to the current supplying circuit through a first multiplexer (MUX) to develop a second cell current. The second cell current passes through the memory cell to develop a second cell voltage. The reference voltage is a first reference voltage. One of the first and the second reference voltages is provided to the sense amplifier through a second MUX to be respectively compared with one of the first and the second cell voltages to determine the information stored in the memory.

Embodiment 19

In a method for reading a memory, the method includes: providing a memory cell, passing a current and comparing the cell voltage and a reference voltage. The current is passes through the memory cell to form a cell voltage. The cell voltage and a reference voltage are compared to determine an information stored in the memory.

Embodiment 20

In the method according to above-mentioned embodiment, the passing step includes steps of: generating a reference voltage and a clamp voltage, and developing a cell current. The cell current is developed as the current based on the clamp voltage.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A memory, comprising:
   a memory cell;
   a reference circuit including a current source circuit for creating a current to generate a clamp voltage for the memory cell and a reference voltage for a reference cell; and
   a current supplying circuit providing a current created by the current source circuit to flow through the memory cell and to generate a cell voltage via an adjustment of the clamp voltage, the cell voltage being used for incorporating with the reference voltage to determine an information stored in the memory, wherein the currents created to generate the clamp voltage, the reference voltage, and the cell voltage are mirror currents created by the current source circuit.

2. The memory as claimed in claim 1, wherein the current supplying circuit comprises:
   a first current source having a first terminal and a second terminal; and
   a first MOSFET having a first terminal, a second terminal and a gate terminal, wherein the second terminal of the first current source is coupled to the first terminal of the first MOSFET, the second terminal of the first MOSFET is coupled to the memory cell, wherein the cell voltage is obtained at a node where the second terminal of the first current source is coupled to the first terminal of the first MOSFET, and the clamp voltage is provided to the gate of the first MOSFET.

3. The memory as claimed in claim 2 further comprising:
   a first pre-charge circuit having a first output terminal coupled to one of the second terminal of the first current source and the first terminal of the first MOSFET.

4. The memory as claimed in claim 3, wherein the reference circuit further generates a reference current, and comprises a second, a third and a fourth current sources, a first and a second reference resistors, a second and a third MOSFETs, and a second pre-charge circuit,
   wherein each of the second, the third and the fourth current sources, and the first and the second reference resistors has a first and a second terminals, and each of the second and the third MOSFETs has a first, a second and a gate terminal,
   wherein the second current source is coupled to the gate terminal of the second MOSFET and the first terminal of the first reference resistor, the third current source is coupled to the first terminal of the second MOSFET and the gate terminal of the third MOSFET, the fourth current source is coupled to the first terminal of the third MOSFET, the second terminal of the third MOSFET is coupled to the first terminal of the second reference resistor, and the second pre-charge circuit has a first output terminal coupled to one of the second terminal of the fourth current source and the first terminal of the third MOSFET, wherein each of the second, the third and the fourth current sources supplies a reference current, one of the second terminal of the fourth current source and the first terminal of the third MOSFET provides the reference voltage, and one of the second terminal of the third current source and the first terminal of the second MOSFET provides the clamp voltage.

5. The memory as claimed in claim 1 further comprising a second reference circuit generating a second reference current, a second reference voltage and a second clamp voltage, wherein the clamp voltage and the second clamp voltage are provided to the current supplying circuit through a first multiplexer (MUX), one of the reference voltage and the second reference voltage is provided to the sense amplifier through a second MUX to be respectively compared with one of the cell voltage and a second cell voltage to determine the information stored in the memory.

6. A method for reading a memory, comprising:
   providing a memory cell;
   providing a reference circuit including a current source circuit for creating a current to generate a clamp voltage for the memory cell and a reference voltage for a reference cell; and
   providing a current supplying circuit to offer a current created by the current source circuit to flow through the memory cell and to generate a cell voltage via an adjustment of the clamp voltage, the cell voltage cooperating with the reference voltage to determine an information stored in the memory, wherein the currents to generate the clamp voltage, the reference voltage, and the cell voltage are mirror currents created by the current source circuit.

7. The method as claimed in claim 6, wherein the current supplying circuit comprises:
   a first current source having a first terminal and a second terminal; and
   a first MOSFET having a first terminal, a second terminal and a gate terminal, wherein the second terminal of the first current source is coupled to the first terminal of the first MOSFET, the second terminal of the first MOSFET is coupled to the memory cell, wherein the cell voltage is obtained at a node where the second terminal of the first current source is coupled to the first terminal of the first MOSFET, and the clamp voltage is provided to the gate of the first MOSFET.

8. The method as claimed in claim 7 further comprising:
   providing a first pre-charge circuit having a first output terminal coupled to one of the second terminal of the first current source and the first terminal of the first MOSFET.

9. The method as claimed in claim 7, wherein the reference circuit generates a reference current, and comprises:
   a second, a third and a fourth current sources, a first and a second reference resistors, a second and a third MOSFETs, and a second pre-charge circuit,
   wherein each of the second, the third and the fourth current sources, and the first and the second reference resistors has a first and a second terminals, and each of the second and the third MOSFETs has a first, a second and a gate terminals;

wherein the second current source is coupled to the gate terminal of the second MOSFET and the first terminal of the first reference resistor, the third current source is coupled to the first terminal of the second MOSFET and the gate terminal of the third MOSFET, the fourth current source is coupled to the first terminal of the third MOSFET, the second terminal of the third MOSFET is coupled to the first terminal of the second reference resistor, and the second pre-charge circuit has a first output terminal coupled to one of the second terminal of the fourth current source and the first terminal of the third MOSFET; and wherein each of the second, the third and the fourth current sources supplies a reference current, one of the second terminal of the fourth current source and the first terminal of the third MOSFET provides the reference voltage, and one of the second terminal of the third current source and the first terminal of the second MOSFET provides the clamp voltage.

10. The method as claimed in claim 6 further comprising a step of using a second reference circuit to generate a second reference current, a second reference voltage and a second clamp voltage, wherein the clamp voltage and the second clamp voltages are provided to the current supplying circuit through a first multiplexer (MUX), one of the reference voltage and the second reference voltage is provided to the sense amplifier through a second MUX to be respectively compared with one of the first and a second cell voltages to determine the information stored in the memory.

11. The memory as claimed in claim 1, wherein the clamp voltage is adjustable by a reference resistor.

12. The method as claimed in claim 6, wherein the clamp voltage is adjustable by a reference resistor.

* * * * *